United States Patent
Toba et al.

(10) Patent No.: US 8,278,169 B2
(45) Date of Patent: Oct. 2, 2012

(54) SEMICONDUCTOR DEVICE AND A METHOD OF MANUFACTURING THE SAME

(75) Inventors: Koichi Toba, Tokyo (JP); Yasushi Ishii, Tokyo (JP); Yoshiyuki Kawashima, Tokyo (JP); Takashi Hashimoto, Tokyo (JP); Kosuke Okuyama, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 160 days.

(21) Appl. No.: 12/885,086

(22) Filed: Sep. 17, 2010

(65) Prior Publication Data
US 2011/0008943 A1    Jan. 13, 2011

Related U.S. Application Data

(62) Division of application No. 12/132,609, filed on Jun. 3, 2008, now abandoned.

(30) Foreign Application Priority Data

Jun. 27, 2007    (JP) ................................ 2007-168915

(51) Int. Cl.
     *H01L 21/336*    (2006.01)
(52) U.S. Cl. ........ 438/258; 438/257; 438/261; 438/264; 438/287
(58) Field of Classification Search .................. 438/257, 438/258, 261, 264, 287
     See application file for complete search history.

(56) References Cited

U.S. PATENT DOCUMENTS

| | | | |
|---|---|---|---|
| 6,728,133 B2 | 4/2004 | Shimizu | |
| 6,784,057 B2 | 8/2004 | Nishioka | |
| 2003/0007384 A1 | 1/2003 | Shimizu | |
| 2004/0109342 A1 | 6/2004 | Fujino | |
| 2004/0132247 A1* | 7/2004 | Kasuya | 438/257 |
| 2005/0029578 A1 | 2/2005 | Nishizaka | |
| 2005/0122764 A1 | 6/2005 | Takashima | |
| 2006/0050558 A1 | 3/2006 | Katayama | |
| 2008/0153232 A1* | 6/2008 | Wong et al. | 438/261 |
| 2008/0227254 A1* | 9/2008 | Rao et al. | 438/261 |

FOREIGN PATENT DOCUMENTS

| | | |
|---|---|---|
| JP | 11-31102 A | 2/1999 |
| JP | 2003-22687 A | 1/2003 |
| JP | 2006-260703 A | 9/2006 |

OTHER PUBLICATIONS

S.M. Sze, "Semiconductor Devices. Physics and Technology. 2nd Edition", (C) John Wiley and Sons, pp. 509-510.

* cited by examiner

*Primary Examiner* — Mamadou Diallo
(74) *Attorney, Agent, or Firm* — Miles & Stockbridge P.C.

(57) ABSTRACT

The present invention provides a technology capable of reducing an area occupied by a nonvolatile memory while improving the reliability of the nonvolatile memory. In a semiconductor device, the structure of a code flash memory cell is differentiated from that of a data flash memory cell. More specifically, in the code flash memory cell, a memory gate electrode is formed only over the side surface on one side of a control gate electrode to improve a reading speed. In the data flash memory cell, on the other hand, a memory gate electrode is formed over the side surfaces on both sides of a control gate electrode. By using a multivalued memory cell instead of a binary memory cell, the resulting data flash memory cell can have improved reliability while preventing deterioration of retention properties and reduce its area.

6 Claims, 14 Drawing Sheets

FIG. 2

|  4a | 4b |
|---|---|
| CODE FLASH MEMORY | DATA FLASH MEMORY |
| USED FOR: STORAGE OF PROGRAM | USED FOR: DATA STORAGE |
| REWRITING: ABOUT 1000 TIMES | REWRITING: ABOUT 10000 TIMES OR MORE |
| MEMORY CURRENT: ABOUT 20 μA | MEMORY CURRENT: ABOUT 10 μA |

FIG. 5

| | Vd | Vcg | Vmg | Vs | Vb |
|---|---|---|---|---|---|
| WRITE | 1V | Vdd | 12V | 6V | 0V |
| ERASE | 0V | 0V | -6V | 6V | 0V |
| READ | Vdd | Vdd | Vdd | 0V | 0V |

Vdd=1.5V

TYPICAL READING METHOD (1 CELL/BIT)

COMPLEMENTARY READING METHOD (2 CELLS/BIT)

FIG. 8

| | Vd | Vcg | Vmg1 | Vmg2 | Vs | Vb |
|---|---|---|---|---|---|---|
| WRITE | 1V | Vdd | 12V | 6V | 6V | 0V |
| ERASE | 0V | 0V | -6V | 0V | 6V | 0V |
| READ | Vdd | Vdd | Vdd | 6V | 0V | 0V |

Vdd=1.5V

FIG. 9

|       | Vd | Vcg | Vmg1 | Vmg2 | Vs  | Vb |
|-------|----|-----|------|------|-----|-----|
| WRITE | 6V | Vdd | 6V   | 12V  | 1V  | 0V |
| ERASE | 6V | 0V  | 0V   | -6V  | 0V  | 0V |
| READ  | 0V | Vdd | 6V   | Vdd  | Vdd | 0V |

Vdd=1.5V

SEMICONDUCTOR DEVICE AND A METHOD OF MANUFACTURING THE SAME

CROSS-REFERENCE TO RELATED APPLICATIONS

This application is a division of application Ser. No. 12/132,609 filed Jun. 3, 2008 now abandoned. The disclosure of Japanese Patent Application No. 2007-168915 filed on Jun. 27, 2007 including the specification, drawings and abstract is also incorporated herein by reference in its entirety.

The disclosure of Japanese Patent Application No. 2007-168915 filed on Jun. 27, 2007 including the specification, drawings and abstract is incorporated herein by reference in its entirety.

BACKGROUND OF THE INVENTION

The present invention relates to a semiconductor device and a manufacturing technology thereof, in particular, to a nonvolatile semiconductor memory device having, over one semiconductor substrate thereof, both a binary memory cell and a multivalued memory cell and a technology effective when applied to the manufacture of the device.

Japanese Patent Laid-Open No. 2003-22687 describes a technology of improving the reliability of a nonvolatile semiconductor memory device and reducing an area occupied by a memory array. More specifically, according to this technology, an address region of a binary mode memory cell in which one memory cell stores one bit of data and an address region of a multivalued memory cell in which one memory cell stores multiple bits of data are fixed, respectively. Fixing of the address regions in such a manner makes it possible to optimize the binary memory cell and the multivalued memory individually.

Japanese Patent Laid-Open No. Hei 11 (1999)-31102 describes a technology of having a binary memory and a multivalued memory on one substrate. It also describes a technology of controlling this semiconductor device having a plurality of memories, that is, a binary memory and a multivalued memory to select the optimum one from them, depending on data accessed by a host system.

Japanese Patent Laid-Open No. 2006-260703 describes a nonvolatile semiconductor memory device facilitating realization of a multivalued memory while preventing control of a threshold voltage and a read-out circuit from becoming complicated. In this nonvolatile semiconductor memory device, a memory gate electrode is formed over the side surfaces on both sides of a control gate electrode.

SUMMARY OF THE INVENTION

As an electrically programmable and erasable nonvolatile memory (nonvolatile semiconductor memory device), EEPROMs (Electrically Erasable and Programmable Read Only Memories) or flash memories are popular. Such nonvolatile memories typified by EEPROMs or flash memories which are used popularly now each has, below a gate electrode of their MOS (Metal Oxide Semiconductor) transistor, a charge storage film such as conductive floating gate electrode or trap insulating film encompassed by a silicon oxide film. They store data by utilizing a difference in the threshold value of a transistor, depending on the charge accumulation state in the floating gate electrode or trap insulating film.

This trap insulating film is an insulating film having trap levels capable of accumulating charges therein and one example of it is a silicon nitride film. By injection or release of charges into or from such a trap insulating film, the threshold value of the MOS transistor is shifted to get the memory device to work. A nonvolatile memory having this trap insulating film as a charge storage film is called a MONOS (Metal Oxide Nitride Oxide Semiconductor) transistor. It is superior in the reliability of data retention to a transistor having a conductive floating gate electrode as the charge storage film, because it accumulates charges in discrete trap levels. In addition, owing to excellent reliability of data retention, a silicon oxide film laid over and below the trap insulating film can be thinned, making it possible to decrease the voltage applied upon write/erase operations.

There is, for example, a semiconductor device obtained by forming a microcomputer on one semiconductor chip. This semiconductor chip having a microcomputer formed thereon has a central processing unit (CPU) composed of a logic circuit such as CMISFET (Complementary Metal Insulator Semiconductor Field Effect Transistor) or a memory. As the memory, it uses, for example, electrically programmable nonvolatile memories as described above. The nonvolatile memories include a memory for storing a program for operating the central processing unit and a memory for storing data to be processed at this central processing unit.

Of the nonvolatile memories, the memory for storing a program for operating the central processing unit needs a high reading speed. The memory for storing data to be processed at the central processing unit, on the other hand, needs high rewrite resistance. This means that since rewriting of the program itself is not performed so frequently in the memory for storing a program for operating the central processing unit, it is not required to have high rewrite resistance, but is required to have an ability of reading the program at high speed. The memory for storing data to be processed at the central processing unit, on the other hand, is not required to read data at high speed, but is required to have high rewrite resistance because rewriting is performed frequently.

This suggests that nonvolatile memories are required to have respective performances depending on data to be stored therein. Even if a nonvolatile memory for storing a program and a nonvolatile memory for storing data are the same in the structure of their memory cell, they are different in their operation method. For example, in the nonvolatile memory for storing a program, one memory cell configures one bit to improve a reading speed. In the nonvolatile memory for storing data, on the other hand, two memory cells configure one bit to suppress deterioration of retention properties caused by frequent rewriting, thereby improving the reliability of the nonvolatile memory.

A memory cell composed of a MONOS transistor has, for example, the following structure. A control gate electrode is formed over a semiconductor substrate via a gate insulating film; a film stack including a charge storage film is formed over a side surface on one side of the control gate electrode; and a memory gate electrode having a sidewall shape is formed over this film stack. In a nonvolatile memory for storing a program by using, as its memory cell, such a memory cell having the above-described structure, one memory cell configures one bit. In a nonvolatile memory for storing data by using, as its memory cell, such a memory cell having a similar structure, two memory cells configure one bit. The nonvolatile memory for storing data therefore needs memory cells twice as much as that of the bit number, leading to a problem such as an increase in the area of a semiconductor chip.

Storage of multiple bits of data instead of two bits of data in a memory cell is considered as a method for reducing an area occupied by the nonvolatile memory formed over the semiconductor chip. In the case where a memory cell has a silicon nitride film as its charge storage film and has a memory gate electrode with a sidewall shape, however, it is difficult to form a multivalued memory cell without changing the structure of a binary memory cell. One of the causes of difficulty resides in that in a film such as a silicon nitride film which accumulates charges in the trap levels in the film, an amount of charges accumulated in the trap levels is not uniform due to a difference in the number of the trap levels in the film between memory cells. Another cause is that memory gate electrodes having a sidewall shape are apt to differ in gate length. Because of the above-described causes, an increase in the distribution of a threshold voltage between memory cells leads to a difficulty in the formation of a multivalued memory cell having the same structure as that of a binary memory cell.

An object of the present invention is to provide a technology capable of reducing an area occupied by a nonvolatile memory while improving the reliability of the nonvolatile memory.

The above-described and other objects and novel features of the present invention will be apparent from the description herein and accompanying drawings.

Typical inventions disclosed by this application will next be outlined briefly.

A semiconductor device according to the present invention is equipped with (a) a semiconductor substrate forming a semiconductor chip, (b) a first nonvolatile memory cell formed in a first region of the semiconductor substrate, and (c) a second nonvolatile memory cell formed in a second region of the semiconductor substrate. In this semiconductor device, the first nonvolatile memory cell is a binary memory cell for storing one bit of data, while the second nonvolatile memory cell is a multivalued memory cell for storing multiple bits of data. This invention is characterized by that the first nonvolatile memory cell and the second nonvolatile memory cell are different in shape.

A manufacturing method of a semiconductor device according to the present invention relates to a manufacturing method of a semiconductor device by forming a first nonvolatile memory cell in a first region of a semiconductor substrate and forming a second nonvolatile memory cell in a second region of the semiconductor substrate. It comprises the steps of (a) depositing an insulating film over the whole surface of the semiconductor substrate including the first region and the second region to form a first gate insulating film in the first region and a third gate insulating film in the second region; (b) depositing a first conductor film over the first gate insulating film and the third gate insulating film; (c) patterning the first conductor film to form a first control gate electrode of the first nonvolatile memory cell in the first region and a second control gate electrode of the second nonvolatile memory cell in the second region; (d) introducing an impurity into the semiconductor substrate in alignment with the first control electrode and into the semiconductor substrate in alignment with the second control electrode; (e) forming a film stack of insulating films over the whole surface of the semiconductor substrate covering the first control gate electrode formed in the first region and the second control gate electrode formed in the second region; (f) depositing a second conductor film over the film stack; (g) anisotropically etching the second conductor film to form sidewalls made of the second conductor film over the side surfaces on both sides of the first control gate electrode in the first region and over the side surfaces on both sides of the second control gate electrode in the second region; (h) removing the sidewall from the side surface on one side of the first control gate electrode in the first region; and (i) removing the film stack exposed from the semiconductor substrate. In this method, a first memory gate electrode is formed by the sidewall remaining over the side surface on one side of the first control gate electrode in the first region, thereby forming the first nonvolatile memory cell which is a binary memory cell, while a second memory gate electrode and a third memory gate electrode are formed by the sidewalls remaining over the sidewalls on both sides of the second control gate electrode in the second region, thereby forming the second nonvolatile memory cell which is a multivalued memory cell.

Advantages available from the typical inventions disclosed by the present application will next be described briefly.

The present invention makes it possible to reduce an area occupied by a nonvolatile memory while improving the reliability of the nonvolatile memory.

BRIEF DESCRIPTION OF THE DRAWINGS

FIG. 2 is a schematic diagram simply showing a difference between a code flash memory and a data flash memory;

FIG. 5 is a table showing application conditions of a voltage to each site of the code flash memory cell;

FIG. 8 is a table showing application conditions of a voltage to each site of the data flash memory cell;

FIG. 9 is a table showing application conditions of a voltage to each site of the data flash memory cell;

DETAILED DESCRIPTION OF THE PREFERRED EMBODIMENTS

Figure 1:
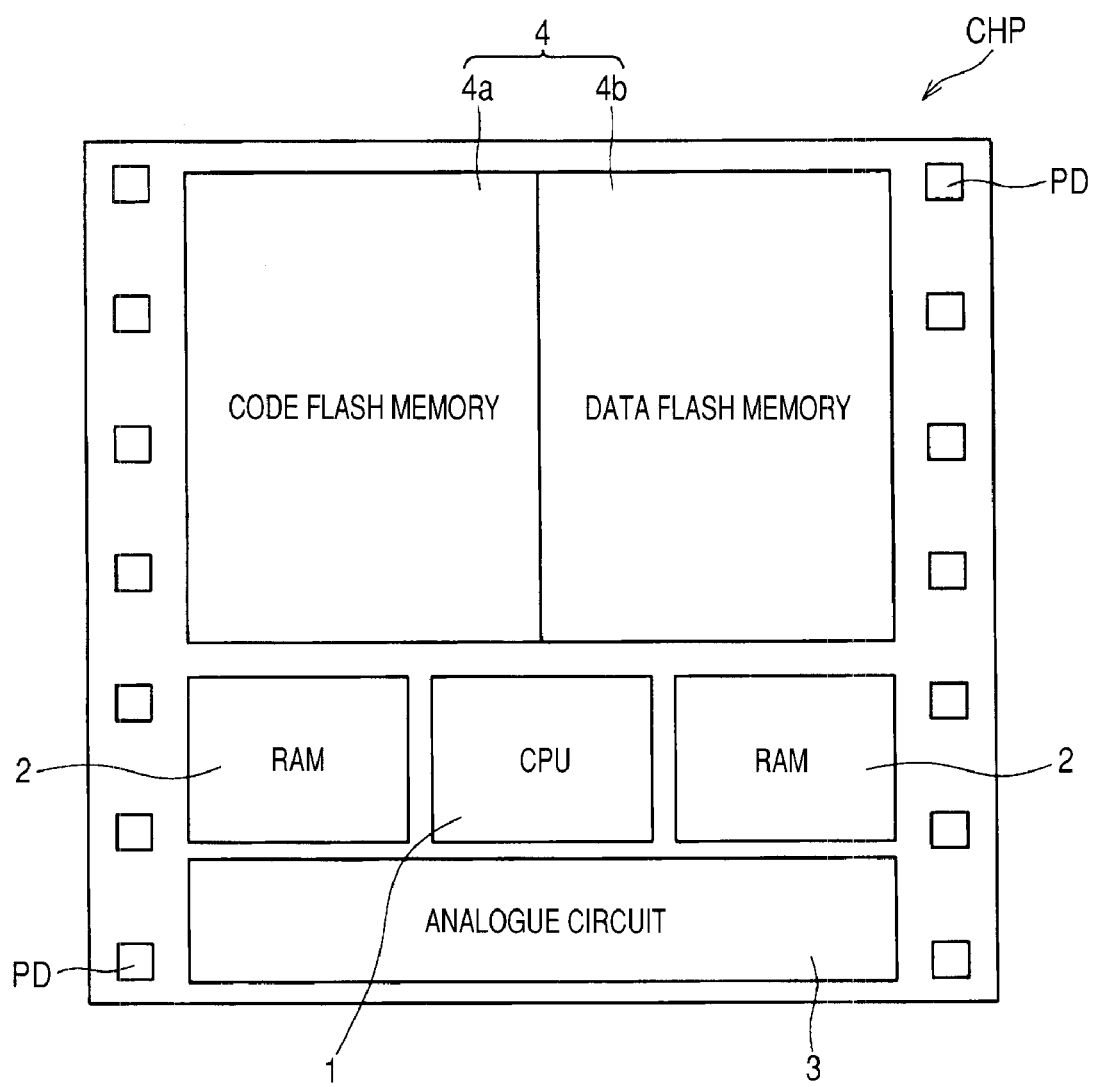
FIG. 1 is a plan view illustrating the layout structure of a semiconductor chip according to Embodiment 1 of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be greater than or less than the specific number unless otherwise specifically indicated or principally apparent that the number is limited to the specific number.

Moreover in the below-described embodiments, it is needless to say that the constituent elements (including element steps) are not always essential unless otherwise specifically indicated or principally apparent that they are essential.

Similarly, in the below-described embodiments, when a reference is made to the shape or positional relationship of the constituent elements, that substantially analogous or similar to it is also embraced unless otherwise specifically indicated or obviously different in principle. This also applies to the above-described value and range.

In all the drawings for describing the below-described embodiments, members having like function will be identified by like reference numerals and overlapping descriptions will be omitted. In the drawings used in these embodiments, even a plan view is sometimes hatched to facilitate understanding of the drawing.

Embodiment 1

FIG. 1 is a plan view illustrating a semiconductor chip (semiconductor substrate) CHP having, for example, a microcomputer formed thereon. It illustrates a layout structure of elements formed on the semiconductor chip CHP. In FIG. 1, the semiconductor chip CHP has a CPU (Central Processing Unit)$_1$, a RAM (Random Access Memory) 2, an analogue circuit 3 and a nonvolatile memory 4.

The CPU (circuit) 1 is also called a central processing unit and serves as the heart of a computer or the like. This CPU 1 fetches and decodes instructions from a memory device and based on them, it performs a variety of arithmetic and control operations. It needs high-speed processing properties. Among elements which the semiconductor chip CHP has, an MISFET forming the CPU 1 is therefore required to have a relatively high current drive force. In short, the CPU 1 is made of a low-breakdown-voltage MISFET.

The RAM (circuit) 2 is a memory capable of reading the stored data at random, that is, data stored as needed, or writing the stored data newly. It is also called random access memory. There are two different types of RAM as an IC memory: DRAM (Dynamic RAM) using a dynamic circuit and SRAM (Static RAM) using a static circuit. The DRAM is a random access memory requiring a memory retaining operation and SRAM is a random access memory not requiring a memory retaining operation. Since the RAM 2 is required to have a high speed operation, a MISFET forming the RAM 2 needs a relatively high current drive force. In short, the RAM 2 is made of a low-breakdown-voltage MISFET.

The analogue circuit 3 is a circuit handling signals of a voltage or current which show a continuous time-dependent change, that is, analog signals. It has, for example, an amplifier circuit, conversion circuit, modulation circuit, oscillation circuit and power supply circuit. For these analog circuits 3, a MISFET having a relatively high breakdown voltage is used compared with another element formed over the semiconductor chip CHP.

The nonvolatile memory 4 is a kind of a nonvolatile memory capable of electrically rewriting both write operation and erase operation. It is also called an electrically erasable programmable read only memory. The memory cell of this nonvolatile memory 4 has a MISFET for selecting a memory cell and a FET for storage (memory), for example, a MONOS (Metal Oxide Nitride Oxide Semiconductor) type FET. The nonvolatile memory makes use of, for example, hot electron injection or the Fowler-Nordheim tunneling phenomenon for its write operation and the Fowler-Nordheim tunneling phenomenon or hot hole injection for its erase operation. It is needless to say that the hot electron injection and hot hole injection may be reversed.

The nonvolatile memories 4 are used for storage of various data because they are electrically rewritable and do not lose stored data even if the power source is turned OFF. Various data such as program for operating the CPU and data used in CPU are stored. The program and data stored in nonvolatile memories are used for respective purposes so that properties required of the nonvolatile memories for storing such data are different. For example, a program for operating the CPU is not rewritten frequently but must be read at high speed. The data used in CPU are not required to be read at high speed, but are required to be resistant against frequent rewriting. Thus, nonvolatile memories 4 are required to have different properties, depending on the data to be stored.

The nonvolatile memories 4 are therefore memories different in properties. As illustrated in FIG. 1, in Embodiment 1, the nonvolatile memories 4 are a code flash memory 4a and a data flash memory 4b, respectively. The code flash memory 4a stores therein, for example, a program for operating the CPU, while the data flash memory 4b stores therein, for example, data to be used in the CPU. The code flash memory 4a is therefore a memory required to have a high reading speed, while the data flash memory 4b is a memory required to have rewrite resistance.

The CPU 1, RAM 2, analogue circuit 3 and nonvolatile memories 4 described above are formed in an inner (core) region of the semiconductor chip CHP. In a peripheral region located outside the inner region, an input/output circuit (not illustrated) to be an interface between the circuits formed in the inner region and a circuit outside the semiconductor chip CHP is formed. This input/output circuit is connected to a pad PD formed in the peripheral region of the semiconductor chip CHP. The pad PD is an external connection terminal for connecting the semiconductor chip CHP to outside. The semiconductor chip CHP is electrically connected to the outside via a wire made of, for example, a gold wire. The semiconductor chip CHP in this Embodiment 1 has such a structure. The nonvolatile memories 4 formed on the semiconductor chip CHP will next be described. The nonvolatile memories 4 include the code flash memory 4a and data flash memory 4b. The properties of each of the code flash memory 4a and data flash memory 4b will next be described, referring to FIG. 2.

FIG. 2 briefly shows a difference between the code flash memory 4a and data flash memory 4b. In FIG. 2, the code flash memory 4a is a memory used for storing a program for operating the CPU. The rewriting frequency of the code flash memory 4a is about 1000 times and a reading current thereof (memory current) is about 20 μA. The data flash memory 4b, on the other hand, is a memory used for storing data to be used in CPU or the like. The rewriting frequency of the data flash memory 4b is about 10000 times or more and its reading current (memory current) is about 10 μA.

Comparison between the code flash memory 4a and data flash memory 4b has revealed that the rewriting frequency (about 10000 times or more) of the data flash memory 4b is much greater than the rewriting frequency (about 1000 times) of the code flash memory 4a. In the data flash memory 4b, therefore, the reliability of data must be ensured even after an increase in the rewriting frequency. This means that rewrite resistance is required. In the code flash memory 4a, on the other hand, a program is stored and improvement in the reading speed of this program is required. These findings suggest that high reading speed is required in the code flash memory 4a, while improvement in rewrite resistance is required in the data flash memory 4b.

In this Embodiment 1, the nonvolatile memories 4 don't have the same memory cell structure but have different memory cell structures, meaning that they include the code flash memory 4a and data flash memory 4b different in properties, which is one of the characteristics of this Embodiment 1. The respective memory cell structures of the code flash memory 4a and data flash memory 4b will next be described.

Figure 3:
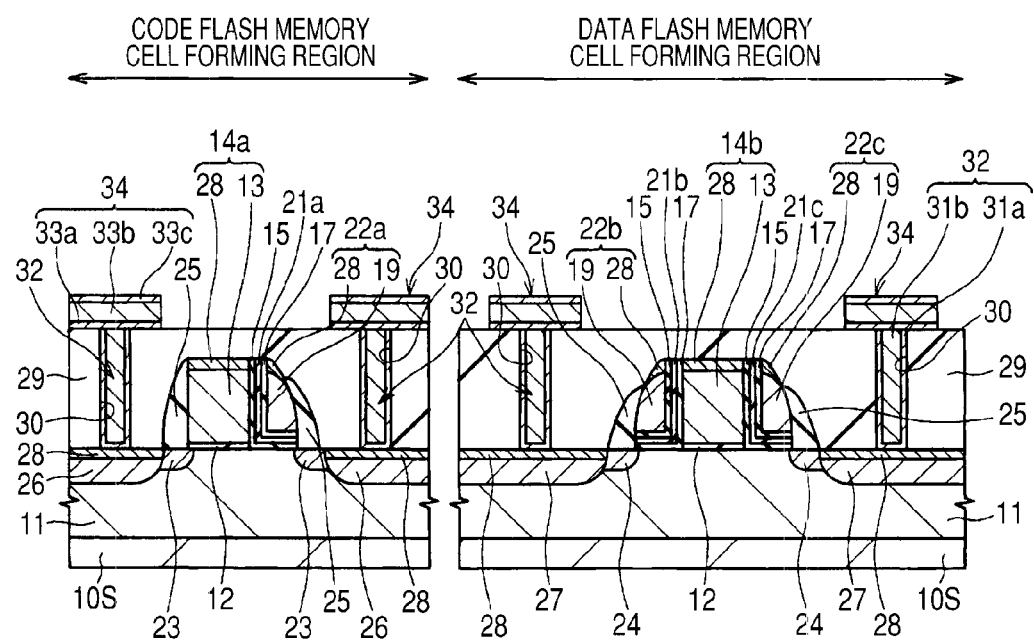
FIG. 3 is a cross-sectional view illustrating the structures of the code flash memory cell and data flash memory cell in Embodiment 1.

FIG. 3 is a cross-sectional view showing respective memory cells formed in a code flash memory forming region and a data flash memory forming region over the semiconductor chip. First, the structure of the code flash memory cell (first nonvolatile memory cell) formed in the code flash memory forming region will be described.

As illustrated in FIG. 3, in the code flash memory forming region, a p well 11 is formed over a semiconductor substrate 10S and over this p well 11, a code flash memory cell is formed. This code flash memory cell is composed of a select portion for selecting a memory cell and a memory portion for storing data. First, the structure of the select portion for selecting a memory cell will be described. The code flash memory cell has a gate insulating film (first gate insulating film) 12 formed over the semiconductor substrate 10S (p well 11) and over this gate insulating film 12, a control gate electrode (control electrode) (first control gate electrode) 14a is formed. The gate insulating film 12 is made of, for example, a silicon oxide film, while the control gate electrode 14a is made of a polysilicon film 13 and a cobalt silicide film 28 formed over the polysilicon film 13. This cobalt silicide film 28 is formed to reduce the resistance of the control gate electrode 14a. The control gate electrode 14a has a function of selecting the code flash memory cell. This means that the control gate electrode 14 selects a certain code flash memory cell and a write, erase or read operation is performed for the code flash memory cell thus selected.

The structure of the memory portion of the code flash memory cell will next be described. A memory gate electrode (first memory gate electrode) 22a is formed on the side wall on one side of the control gate electrode 14a via a film stack (first film stack) composed of an insulating film. The memory gate electrode 22a is in the form of a sidewall formed on the side wall on one side of the control gate electrode 14a and it is composed of a polysilicon film 19 and the cobalt silicide film 28 formed over the polysilicon film 19. The cobalt silicide film 28 is formed to reduce the resistance of the memory gate electrode 22a.

Between the control gate electrode 14a and memory gate electrode 22a and between the memory gate electrode 22a and semiconductor substrate 10S, a film stack is formed. This film stack is composed of a silicon oxide film (second gate insulating film) 15 formed over the semiconductor substrate 10S, a charge storage film (first charge storage film) 21a formed over the silicon oxide film 15, and a silicon oxide film (first insulating film) 17 formed over the charge storage film 21a. The silicon oxide film 15 functions as a gate insulating film formed between the memory gate electrode 22a and semiconductor substrate 10S. The gate insulating film made of the silicon oxide film 15 functions also as a tunnel insulating film. For example, the memory portion of the code flash memory cell saves or erases data by injecting electrons into the charge storage film 21a or injecting holes into the charge storage film 21a from the semiconductor substrate 10S via the silicon oxide film 15 so that the silicon oxide film 15 functions as a tunnel insulating film. The write operation, erase operation, or read operation of a memory cell by utilizing this tunnel effect of electrons will be described specifically later.

The charge storage film 21a formed over the silicon oxide film 15 has a function of accumulating charges in it. Described specifically, in this Embodiment 1, the charge storage film 21a is made of a silicon nitride film. The memory portion of the code flash memory cell in this Embodiment 1 saves data by controlling an electric current flowing in the semiconductor substrate 10S below the memory gate electrode 22a, depending on the presence or absence of charges to be accumulated in the charge storage film 21a. In other words, the data are stored by making use of a change in a threshold voltage of an electric current flowing in the semiconductor substrate 10S below the memory gate electrode 22a, depending on the presence or absence of charges to be accumulated in the charge storage film 21a.

In this Embodiment 1, an insulating film having trap levels is employed as the charge storage film 21a. A silicon nitride film is one example of an insulating film having trap levels. Not only a silicon nitride film but also, for example, an aluminum oxide (alumina) film may be employed. When an insulating film having trap levels is employed as the charge storage film 21a, charges are captured in the trap levels formed in the insulating film. Charges are captured by the trap levels and accumulated in the insulating film.

A polysilicon film has conventionally been used mainly as the charge storage film 21a. When a polysilicon film is used as the charge storage film 21a, however, a partial defect, if any, of the silicon oxide film 15 or silicon oxide film 17 encompassing the charge storage film 21a may lead to leakage of all the charges accumulated in the charge storage film 21a due to abnormal leakage because the charge storage film 21a is a conductor film.

A silicon nitride film which is an insulator has therefore come to be used as the charge storage film 21a. In this case, charges contributing to data storage are accumulated in the discrete trap levels (trapping levels) present in the silicon nitride film. A partial defect, if any, of the silicon oxide film 15 or silicon oxide film 17 encompassing the charge storage film 21a does not lead to leakage of all the charges accumulated in the charge storage film 21a because the charges are accumulated in the discrete trap levels of the charge storage film 21a. This results in improvement of reliability of data retention.

Owing to the above-described reason, reliability of data retention can be improved by using, as the charge storage film 21a, not only a silicon nitride film but also a film having discrete trap levels.

The control gate electrode 14a has, over the side surface on one side thereof, the memory gate electrode 22a and, over the side surface on the other side, a sidewall 25 made of a silicon oxide film. Similarly, the memory gate electrode 22a has, over the side surface on one side thereof, the control gate electrode 14a and, over the side surface on the other side, a sidewall 25 made of a silicon oxide film.

In the semiconductor substrate 10S just below the sidewall 25, a pair of shallow lightly-doped impurity diffusion regions 23 which are n type semiconductor regions are formed and in outer regions contiguous to the pair of shallow lightly-doped impurity diffusion regions 23, a pair of deep heavily-doped impurity diffusion regions 26 are formed. The heavily-doped impurity diffusion regions 26 are also n type semiconductor regions and on the surface of the heavily-doped impurity diffusion regions 26, the cobalt silicide film 28 is formed. The pair of lightly-doped impurity diffusion regions 23 and the pair of heavily-doped impurity diffusion regions 26 form a source region and a drain region of the code flash memory cell. The source region and the drain region made of the lightly-doped impurity diffusion regions 23 and heavily-doped impurity diffusion regions 26 have therefore an LDD (Lightly Doped Drain) structure. Here, a transistor composed of the gate insulating film 12, the control gate electrode 14a formed over the gate insulating film 12, and the above-described source and drain regions will hereinafter be called "select transistor". On the other hand, a transistor composed of a film stack having the silicon oxide film 15, charge storage film 21a, and silicon oxide film 17, the memory gate electrode 22a formed over the film stack, and the above-described source and drain regions will hereinafter be called "memory transistor". This means that the select portion of the code flash memory cell is composed of the select transistor, while the memory portion of the code flash memory cell is composed of the memory transistor.

The code flash memory cell has such a structure. In this Embodiment 1, a structure in which the memory gate electrode 22a is formed only over the side surface on one side of the control gate electrode 14a is adopted as the structure of the code flash memory cell. As will be described later, this structure enables improvement in a reading speed compared with a structure in which a memory gate electrode is formed over the side surfaces on both sides of the control gate electrode. In other words, the code flash memory cell employs a structure in which the memory gate electrode 22a is formed only over the side surface on one side of the control gate electrode to improve a reading speed. This means that the code flash memory cell is suited for the storage of a program which requires a high reading speed. It is to be noted that the code flash memory cell is a memory cell having one memory portion (memory transistor) and this memory portion stores therein one bit of data. This means that the code flash memory cell is a binary memory cell which stores 1 bit of data per cell.

An interconnect structure to be connected to the code flash memory cell will next be described. Over the code flash memory cell, a silicon oxide film 29 which is an interlayer insulating film is formed to cover the code flash memory cell. In this silicon oxide film 29, a contact hole 30 penetrating through the silicon oxide film 29 and reaching the heavily-doped impurity diffusion regions 26 forming the source region or drain region is formed. Inside the contact hole 30, a titanium/titanium nitride film 31a which is a barrier conductor film is formed and a tungsten film 31b is formed to fill the contact hole 30 therewith. By filling the titanium/titanium nitride film 31a and tungsten film 31b in the contact hole 30 in such a manner, a conductive plug 32 is formed. Over the silicon oxide film 29 which is an interlayer insulating film, an interconnect 34 is formed and the interconnect 34 and the plug 32 are electrically connected to each other. The interconnect 34 is made of, for example, a film stack of a titanium/titanium nitride film 33a, an aluminum film 33b and a titanium/titanium nitride film 33c.

Figure 4:
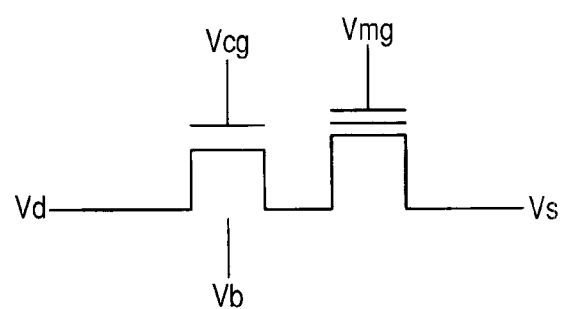
FIG. 4 is a schematic view illustrating the structure of the code flash memory cell.

The code flash memory cell of this Embodiment 1 has a structure as described above. The operation of the code flash memory cell will next be described with reference to accompanying drawings. FIG. 4 is a schematic view illustrating the structure of the code flash memory cell according to Embodiment 1. In FIG. 4, Vcg represents a voltage to be applied to a control gate electrode, Vmg represents a voltage to be applied to a memory gate electrode, Vs and Vd represent voltages to be applied to a source region and a drain region, respectively, and Vb represents a voltage to be applied to a semiconductor substrate.

FIG. 5 is a table showing application conditions of a voltage to each site of the code flash memory cell during "write", "erase" and "read" operations. Here, injection of electrons into a silicon nitride film which is a charge storage film is defined as "write" and injection of holes into the silicon nitride film is defined as "erase".

First, a write operation will be described. The write operation is performed by hot electron writing which is a so-called source-side injection method. During the write operation, for example, a voltage Vs to be applied to the source region is set at 6V; a voltage Vmg to be applied to the memory gate electrode is set at 12V; a voltage Vcg to be applied to the control gate electrode is set at 1.5V. And, a voltage Vd to be applied to the drain region is controlled so that a channel current during the write operation becomes a predetermined value. The voltage Vd at this time is determined by a predetermined value of the channel current and a threshold voltage value of the select transistor having the control gate electrode. It is, for example, approximately 1V. A voltage Vb to be applied to the p well (semiconductor substrate) is 0 V.

Movement of charges when the write operation is performed by applying such voltages will next be described. As described above, by providing a potential difference between the voltage Vs to be applied to the source region and the voltage Vd to be applied to the drain region, electrons flow in a channel region formed between the source and drain regions. Electrons flowing in the channel region are accelerated in the channel region (between source and drain regions) below the vicinity of the boundary between the control gate electrode and memory gate electrode and become hot electrons. In a perpendicular-oriented electric field due to positive voltage (Vmg=12V) applied to the memory gate electrode, hot electrons are injected into the silicon nitride film (charge storage film) below the memory gate electrode. The hot electrons thus injected are captured by trap levels in the silicon nitride film. As a result, electrons are accumulated in the silicon nitride film and a threshold voltage of the memory transistor increases. The write operation is performed in such a manner.

Next, an erase operation will be described. The erase operation is performed, for example, as BTBT (Band to Band Tunneling) erase using, for example, a band-to-band tunneling phenomenon. In BTBT erase, for example, a voltage Vmg to be applied to the memory gate electrode is set at −6V, a voltage Vs to be applied to the source region is set at 6V, a voltage Vcg to be applied to the control gate electrode is set at 0V and a voltage to be applied to the drain region is set at 0V. Due to the voltage applied between the source region and memory gate electrode, holes generated by the band-to-band tunneling phenomenon at the end portion of the source region are accelerated by a high voltage applied to the source region and become hot holes. Some of the hot holes are attracted by the negative voltage applied to the memory gate electrode and injected into the silicon nitride film. The hot holes thus injected are captured by trap levels in the silicon nitride film, resulting in a decrease in a threshold voltage of the code flash memory cell (memory transistor). The erase operation is performed in such a manner.

Next, a read operation will be described. During the read operation, a voltage Vd to be applied to the drain region is set at Vdd (1.5V), a voltage Vs to be applied to the source region is set at 0V, a voltage Vcg to be applied to the control gate electrode is set at Vdd (1.5V), and a voltage Vmg to be applied to the memory gate electrode is set at Vdd (1.5V). The read operation is performed by causing an electric current to flow in a reverse direction to that upon write operation. Alternatively, a voltage Vd to be applied to the drain region and a voltage Vs to be applied to the source region are changed to 0V and 1.5V, respectively and the read operation may be performed in a current direction equal to that upon write operation. At this time, when the code flash memory cell is under a write state and has a high threshold voltage, no current flows through the memory cell. When the code flash memory cell is under an erase state and has a low threshold voltage, on the other hand, a current flows through the memory cell.

It is therefore possible to judge whether the memory cell is under a write state or an erase state by detecting the presence or absence of an electric current flowing through the code flash memory cell. Described specifically, presence or absence of an electric current flowing through the code flash memory cell is detected using a sense amplifier. For example, in order to detect the presence or absence of an electric current flowing through the code flash memory cell, a reference current is employed. When the code flash memory cell is under an erase state, a reading current flows during the read operation. This reading current is compared with the reference current. The reference current is set lower than the reading current under an erase state. When the reading current is greater than the reference current as a result of comparison between the reading current and reference current, the code flash memory cell is judged that it is under an erase state. When the code flash memory cell is under a write state, on the other hand, no reading current flows. When the reading current is smaller than the reference current as a result of comparison between the reading current and reference current, the code flash memory cell can be judged that is under a write state. In such a manner, the read operation is performed.

The structure of the data flash memory cell (second nonvolatile memory cell) formed in the data flash memory cell forming region will next be described.

As illustrated in FIG. 3, in the data flash memory forming region, a p well 11 is formed over the semiconductor substrate 10S and a data flash memory cell is formed over the p well 11. The data flash memory cell is composed of a select portion for selecting a memory cell and a memory portion for storing data. First, the structure of the select portion for selecting a memory cell will be described. The data flash memory cell has a gate insulating film (third gate insulating film) 12 formed over the semiconductor substrate 10S (p well 11). A control gate electrode (control electrode) (second control gate electrode) 14b is formed over the gate insulating film 12. The gate insulating film 12 is made of, for example, a silicon oxide film and a control gate electrode 14b is made of, for example, a polysilicon film 13 and a cobalt silicide film 28 formed over the polysilicon film 13. The cobalt silicide film 28 is formed to reduce the resistance of the control gate electrode 14b. This control gate electrode 14b has a function of selecting the data flash memory cell. In other words, a specific data flash memory cell is selected by the control gate electrode 14b and a write operation, an erase operation, or a read operation to the selected data flash memory cell is performed.

The structure of the memory portion of the data flash memory cell will next be described. The structure of the memory portion of the data flash memory cell differs from the structure of the memory portion of the code flash memory cell, which is one of the characteristics of this Embodiment 1. A memory gate electrode (second memory gate electrode) 22b and a memory gate electrode (third memory electrode) 22c are formed over the side walls on both sides of the control gate electrode 14b, respectively, via film stacks (second film stack and third film stack) each composed of insulating films. The memory gate electrode 22b and memory gate electrode 22c have a sidewall shape formed over the side surface of the control gate electrode 14b and it is composed of a polysilicon film 19 and a cobalt silicide film 28 formed over the polysilicon film 19. The cobalt silicide film 28 is formed to reduce the resistance of the memory gate electrode 22b or 22c. In short, the data flash memory cell in this Embodiment 1 is characterized by that the memory portions are formed over the side surfaces on both sides of the control gate electrode 14b. The memory portions formed on both sides have the same structure. Their structures will be described in detail sequentially.

First, the structure of the memory portion formed over the side surface on the left side of the control gate electrode 14b will be described. Between the control gate electrode 14b and memory gate electrode 22b and between the memory gate electrode 22b and semiconductor substrate 10S, a film stack is formed. This film stack is composed of a silicon oxide film (fourth gate insulating film) 15 formed over the semiconductor substrate 10S, a charge storage film (second charge storage film) 21b formed over the silicon oxide film 15, and a silicon oxide film (second insulating film) 17 formed over the charge storage film 21b. The silicon oxide film 15 functions as a gate insulating film formed between the memory gate electrode 22b and semiconductor substrate 10S. The gate insulating film made of the silicon oxide film 15 functions also as a tunnel insulating film. For example, the memory portion of the data flash memory cell saves or erases data by injecting electrons into the charge storage film 21b or injecting holes into the charge storage film 21b from the semiconductor substrate 10S via the silicon oxide film 15 so that the silicon oxide film 15 functions as a tunnel insulating film.

The charge storage film 21b formed over the silicon oxide film 15 has a function of accumulating charges in it. Described specifically, in this Embodiment 1, the charge storage film 21b is made of a silicon nitride film. The memory portion of the data flash memory cell in this Embodiment 1 saves data by controlling an electric current flowing in the semiconductor substrate 10S below the memory gate electrode 22b, depending on the presence or absence of charges to be accumulated in the charge storage film 21b. In other words, the data are stored by making use of a change in the threshold voltage of an electric current flowing in the semiconductor substrate 10S below the memory gate electrode 22b, depending on the presence or absence of charges to be accumulated in the charge storage film 21b.

Then, the structure of the memory portion formed over the side surface on the right side of the control gate electrode 14b will be described. Between the control gate electrode 14b and memory gate electrode 22c and between the memory gate electrode 22c and semiconductor substrate 10S, a film stack is formed. This film stack is composed of a silicon oxide film (fifth gate insulating film) 15 formed over the semiconductor substrate 10S, a charge storage film (third charge storage film) 21c formed over the silicon oxide film 15, and a silicon oxide film (third insulating film) 17 formed over the charge storage film 21c. The silicon oxide film 15 functions as a gate insulating film formed between the memory gate electrode 22c and semiconductor substrate 10S. The gate insulating film made of the silicon oxide film 15 functions also as a tunnel insulating film. For example, the memory portion of the data flash memory cell saves or erases data by injecting electrons into the charge storage film 21c or injecting holes into the charge storage film 21c from the semiconductor substrate 10S via the silicon oxide film 15 so that the silicon oxide film 15 functions as a tunnel insulating film.

The charge storage film 21c formed over the silicon oxide film 15 has a function of accumulating charges in it. Described specifically, in this Embodiment 1, the charge storage film 21c is made of a silicon nitride film. The memory portion of the data flash memory cell in this Embodiment 1 saves data by controlling an electric current flowing in the semiconductor substrate 10S below the memory gate electrode 22c, depending on the presence or absence of charges to be accumulated in the charge storage film 21c. In other words, the data are stored by making use of a change in the threshold voltage of an electric current flowing in the semiconductor substrate 10S below the memory gate electrode 22c, depending on the presence or absence of charges to be accumulated in the charge storage film 21c.

In the data flash memory cell according to this Embodiment 1, the memory portions are formed on both sides of the select portion. The memory portions formed on both sides of the select portion can independently store 1 bit of data so that the data flash memory cell according to this Embodiment 1 can store 2 bits of data in total. In other words, the data flash memory cell according to this Embodiment 1 is made of a multivalued memory cell capable of storing multiple bits of data.

Next, sidewalls 25 are formed over the side surfaces of the memory gate electrode 22b and the side surfaces of the memory gate electrode 22c. The sidewalls 25 are made of, for example, a silicon oxide film. In the semiconductor substrate 10S just below the sidewalls 25, a pair of shallow lightly-doped impurity diffusion regions 24 which are n type semiconductor regions are formed and in an outer region contiguous to the pair of shallow lightly-doped impurity diffusion regions 24, a pair of deep heavily-doped impurity diffusion regions 27 are formed. The heavily-doped impurity diffusion regions 27 are also n type semiconductor regions and on the surface of the heavily-doped impurity diffusion regions 27, a cobalt silicide film 28 is formed to reduce the resistance. The pair of lightly-doped impurity diffusion regions 24 and the pair of heavily-doped impurity diffusion regions 27 form a source region and a drain region of the data flash memory cell. The source region and the drain region made of the lightly-doped impurity diffusion regions 24 and heavily-doped impurity diffusion regions 27 have therefore an LDD (Lightly Doped Drain) structure.

Here, a transistor composed of the gate insulating film 12, the control gate electrode 14b formed over the gate insulating film 12, and the above-described source and drain regions will hereinafter be called "select transistor". On the other hand, a transistor composed of a film stack having the silicon oxide film 15, charge storage film 21b, and silicon oxide film 17, the memory gate electrode 22b formed over the film stack, and the above-described source and drain regions will hereinafter be called "memory transistor". Moreover, a transistor composed of a film stack having the silicon oxide film 15, charge storage film 21c and silicon oxide film 17, the memory gate electrode 22c formed over the film stack, and the above-described source and drain regions is also a memory transistor. Thus, the select portion of the data flash memory cell has the select transistor, while the memory portion of the data flash memory cell has two memory transistors formed on both sides of the select transistor.

An interconnect structure to be connected to the data flash memory cell will next be described. Over the data flash memory cell, a silicon oxide film 29 which is an interlayer insulating film is formed to cover the data flash memory cell. In this silicon oxide film 29, a contact hole 30 penetrating through the silicon oxide film 29 and reaching the heavily-doped impurity diffusion regions 27 forming the source region or drain region is formed. Inside the contact hole 30, a titanium/titanium nitride film 31a which is a barrier conductor film is formed and a tungsten film 31b is formed to fill the contact hole 30 therewith. The titanium/titanium nitride film 31a and tungsten film 31b are filled in the contact hole 30 in such a manner, whereby a conductive plug 32 is formed. Over the silicon oxide film 29 which is an interlayer insulating film, an interconnect 34 is formed and the interconnect 34 and the plug 32 are electrically connected to each other. The interconnect 34 is made of, for example, a titanium/titanium nitride film 33a, an aluminum film 33b and a titanium/titanium nitride film 33c. In such a manner, the data flash memory cell is formed.

The structure in this Embodiment 1 is characterized by that the structure of the code flash memory cell is differentiated from that of the data flash memory cell. Described specifically, a program requiring a high reading speed is stored in the code flash memory cell. The reading speed is raised by forming the memory transistor (memory portion) only on one side of the select transistor (select portion) in the code flash memory cell. On the other hand, data to be rewritten frequently are stored in the data flash memory cell so that in the data flash memory cell, the memory transistor (memory portion) is formed on both sides of the select transistor (select portion).

A reason why a multivalued memory cell in which memory transistors are formed on both sides of a select transistor is employed will next be described.

Similar to the code flash memory cell, the data flash memory cell has conventionally employed a structure in which a memory transistor is formed only on one side of a select transistor. The data flash memory cell is a memory cell for storing data to be rewritten frequently so that it adopts a reading method having high rewrite resistance. More specifically, it adopts a complementary reading method capable of preventing deterioration of retention properties. In this complementary reading method, one bit of data is stored by two memory cells. In the typical method, one bit of data is stored by one memory cell so that employment of this complementary reading method needs memory cells twice as much as the number of bits to be used, which undesirably increases the area of a semiconductor chip. In short, when deterioration of retention properties is prevented for the purpose of realizing a data flash memory cell having high reliability, an increase in the area of a semiconductor chip occurs as a side effect.

In the data flash memory cell according to this Embodiment 1, an area occupied by the data flash memory cell is reduced by forming a memory transistor on both sides of the select transistor. Described specifically, by replacing the data flash memory cell from a binary memory cell to a multivalued memory cell, the data flash memory cell can have high reliability while preventing deterioration of retention properties and at the same time, the area occupied by the data flash memory cell can be reduced. For such a reason, the data flash memory cell has memory transistors on both sides of the select transistor. According to this Embodiment 1, by differentiating the structure between the code flash memory cell and the data flash memory cell, it is possible to realize memory cell structures suited for the required properties of the respective memory cells while reducing an area occupied by them.

Next, referring to FIG. 6, how the complementary reading method employed in the data flash memory cell can prevent the deterioration of the retention properties and improve the reliability of the data flash memory cell will be described in detail.

Figure 6:
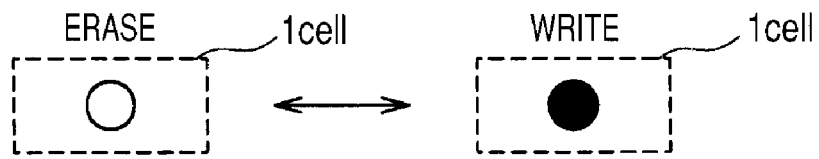
FIG. 6 illustrates a difference between a typical reading method and a complementary reading method.
Figure 6:
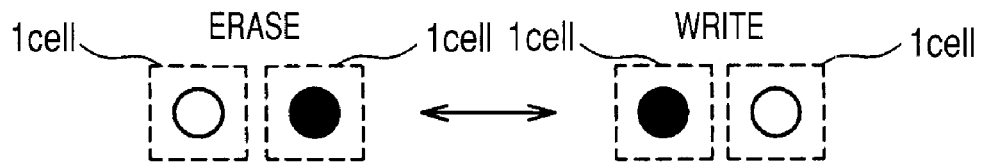

FIG. 6 schematically illustrates a difference in the typical reading method and complementary reading method. First the typical reading method is described. In FIG. 6, in the common memory cell, one memory cell stores one bit of data. For example, supposing that an open circle indicates the state where holes have been injected into a charge storage film, the memory cell with an open circle is under an erase state. Supposing that a solid circle indicates the state where electrons have been injected into the charge storage film, on the other hand, the memory cell with a solid circle is under a write state. Thus, in the common memory cell, the erase state and write state are discriminated by the accumulation state of charges in the charge storage film in one memory cell. Under the erase state, a reading current flows because a threshold voltage of the memory cell decreases. This reading current is set so as to exceed the reference current determined in advance. Under the write state, on the other hand, the reading current scarcely flows because the threshold voltage of the memory cell increases. In this case, the reading current becomes smaller than the reference current. It is possible to judge whether the memory cell is under an erase state or a write state by the magnitude of the reading current relative to the reference current. In other words, in the typical reading method, a difference in the reading current depending on the charge accumulation state of one memory cell is detected by comparison with the reference current.

In the typical reading method, however, repetition of a write operation to a memory cell causes deterioration of retention properties. In other words, repetition of write and erase operations to a memory cell decreases the reading current in the case where the memory cell is under an erase state. The reading current should be greater than the reference current when the memory cell is under an erase state, but owing to a reduction in the reading current, the reading current may become smaller than the reference current even if the memory cell is under an erase state. In the typical reading method, the memory cell is therefore misjudged to be under a write state even if the memory cell is under an erase state. Such misjudgment of the erase state of the memory cell for the write state of the memory cell is called "deterioration of retention properties".

Then, the complementary reading method is described. In the complementary reading method, one bit of data is stored by two memory cells. For example, as illustrated in FIG. 6, the memory cells are under an erase state when one memory cell is under the state (open circle) where holes have been injected into the charge storage film, while the other memory cell is under the state (solid circle) where electrons have been injected into the charge storage film. On the contrary, the memory cells are under a write state when one memory cell (memory cell on the left side) is under the state (solid circle) where electrons have been injected into the charge storage film, while the other memory cell (memory cell on the right side) is under the state (open circle) where holes have been injected into the charge storage film.

A reading method of the erase state and write state is the complementary reading method. In this complementary reading method, an erase state or a write state is judged by comparing a reading current flowing through one memory cell (memory cell on the left side) and a reading current flowing through the other memory cell (memory cell on the right side) without using a reference current. For example, when a reading current flowing through one memory cell (memory cell on the left side) is smaller than a reading current flowing through the other memory cell (memory cell on the right side) as a result of comparison between the reading current flowing through the memory cell on the left side and the reading current flowing through the memory cell on the right side, such a state is judged as an erase state. On the other hand, when a reading current flowing through one memory cell (memory cell on the left side) is greater than the reading current flowing through the other memory cell (memory cell on the right side) as a result of comparison between the reading current flowing through the memory cell on the left side and the reading current flowing through the memory cell on the right side, such a state is judged as a write state. The complementary reading method is such a reading method.

How this complementary reading method can prevent deterioration of retention properties will next be described. As described above, in the complementary reading method, a reference current is not used for discriminating an erase state from a write state. The erase state or write state is judged by comparing a reading current flowing through one memory cell (memory cell on the left side) with a reading current flowing through the other memory cell (memory cell on the right side). Even if write operation and erase operation to the memory cell are repeated and the reading current decreases under the state where holes have been injected into the charge storage film of the memory cell, it does not have a significant influence. In other words, even if reading operations are repeated and a reading current therefore decreases under the state where holes have been injected into the charge storage film of the memory cell, the reading current is greater than that under the state where electrons have been injected into the charge storage film of the memory cell. This means that it is possible to prevent misjudgment between the erase state and write state because a reference current is not used for relative comparison of the reading current between one memory cell and the other memory cell. This is attributable to the fact that even if the reading current decreases under the state where holes have been injected into the charge storage film of the memory cell, it is greater than the reading current under the state where electrons have been injected into the charge storage film of the memory cell so that no reversal occurs in the relationship of the magnitude between the reading current under the state where holes have been injected into the charge storage film of the memory cell and the reading current under the state where electrons have been injected into the charge storage film of the memory cell. In the complementary reading method in which an erase state or write state is judged by comparing a reading current flowing through one memory cell with a reading current flowing through the other memory cell, deterioration of retention properties which will otherwise occur by repetition of rewriting can be prevented.

In a data flash memory cell which carries out rewriting of data frequently, deterioration of retention properties is prevented by utilizing the complementary reading method. In the complementary reading method, however, one bit of data is stored by two memory cells as described above so that an area occupied by the whole memory becomes greater than that of the typical reading method in which one bit of data is stored by one memory cell. In the data flash memory cell in this Embodiment 1, an area occupied by the data flash memory cell is reduced by forming a memory transistor on both sides of a select transistor. This means that by the replacement of the data flash memory cell from a binary memory cell to a multivalued memory cell, deterioration of retention properties can be prevented and as a result, a data flash memory cell has a high reliability and at the same time, an area occupied by the data flash memory cell can be reduced.

Employment of a data flash memory cell having the following structure is also a candidate for reduction of an area occupied by the whole data flash memory. Described specifically, a memory transistor is formed only on one side of a select transistor and a plurality of threshold voltages are set, depending on charges accumulated on a charge storage film of this memory transistor. In other words, the memory transistor is formed only on one side of the select transistor and it is converted into a multivalued memory cell by dividing the threshold value of this memory transistor into plural states. An area occupied by the whole data flash memory can also be reduced by employing such a structure.

If the data flash memory cell employs such a structure, however, first, difficulties are encountered in using the complementary reading method in combination, because in the complementary reading method, a binary memory cell is used mainly. When the memory transistor forming the memory portion of the memory cell is, by itself, a binary one, it is possible to create an erase state and a write state simply by placing two memory cells under different states and changing them as needed. When the memory transistor forming the memory portion of the memory cell is, by itself, a multivalued one, on the other hand, two or more different states exist even in one memory cell. When two memory cells are used for simply creating an erase state and write state, many unused states appear and conversion of the memory transistor into a multivalued one becomes meaningless. In this Embodiment 1, on the other hand, the data flash memory cell is a multivalued one. It is multivalued not by making one memory transistor into a multivalued one but by forming, in one data flash memory cell, two binary memory transistors. In a data flash memory cell multivalued, as in this Embodiment 1, by forming two binary memory transistors on both sides of the select transistor, respectively, even employment of the complementary reading method enables the efficient use of the memory and reduction of an area occupied by the whole data flash memory cell.

Secondly, in this Embodiment 1, an insulating film having trap levels is used as the charge storage film and at the same time, the memory transistor having a sidewall shape is formed over the side surface of the select transistor. It is difficult to convert the memory transistor to a multivalued one by forming the memory transistor only on one side of a select transistor and providing this memory transistor with a plurality of threshold values. One of the reasons for it is that in an insulating film such as silicon nitride film having trap levels, charges are accumulated in the trap levels in the film, but a difference in the number of the trap levels in the film among the memory cells may lead to variations in the accumulated amount of charges. Another reason resides in variations in the gate length of a memory gate electrode having a sidewall shape. For these reasons, distribution of threshold voltages becomes large in the memory cells, which makes it difficult to convert the memory cell into a multivalued one. In this Embodiment 1, on the other hand, the data flash memory cell is a multivalued one. It is multivalued not by converting one memory transistor into a multivalued one but by forming two binary memory transistors in one data flash memory cell. Accordingly, in the data flash memory cell which is multivalued by forming two binary memory transistors on both sides of the select transistor, respectively, as in this Embodiment 1, a threshold voltage in the memory cell is not divided into plural values. The method according to this Embodiment 1 is therefore advantageous in that it facilitates formation of a multivalued memory cell even if an insulating film having trap levels is used as a charge storage film and a memory transistor having a sidewall shape is formed over the side surface of a select transistor.

Figure 7:
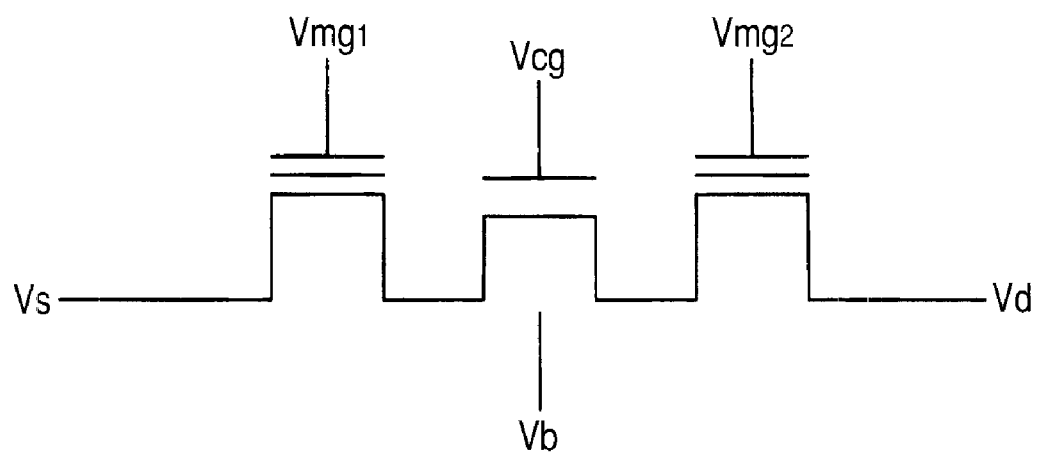
FIG. 7 is a schematic view illustrating the structure of the data flash memory cell.

The data flash memory cell according to this Embodiment 1 has the above-described structure. The operation of the data flash memory cell will next be described referring to some drawings. FIG. 7 schematically illustrates the structure of the data flash memory cell according to this Embodiment 1. In FIG. 7, Vcg represents a voltage to be applied to the control gate electrode; Vmg1 represents a voltage to be applied to the memory gate electrode on the left side; Vmg2 represents a voltage to be applied to the memory gate electrode on the right side; Vs and Vd represent voltages to be applied to the source region and drain region, respectively; and Vb represents a voltage to be applied to the semiconductor substrate.

In the data flash memory cell according to this Embodiment 1, memory transistors are formed on both sides of the select transistor, respectively. First, a method of driving the memory transistor formed on the left side of the select transistor will be described.

FIG. 8 is a table showing application conditions of a voltage to each site of the data flash memory cell at the time of "write", "erase" and "read" when the memory transistor on the left side is driven. Here, injection of electrons into a silicon nitride film which is a charge storage film is defined as "write" and injection of holes into the silicon nitride film is defined as "erase".

First, a write operation will be described. The write operation is performed by hot electron writing which is a so-called source-side injection method. During the write operation, a voltage Vs to be applied to the source region is set at 6V; a voltage Vmg1 to be applied to the memory gate electrode on the left side is set at 12V; a voltage Vmg2 to be applied to the memory gate electrode on the right side is set at 6V; a voltage Vcg to be applied to the control gate electrode is set at Vdd (1.5V). And, a voltage Vd to be applied to the drain region is controlled so that a channel current during the write operation becomes a preset value. The voltage Vd at this time is determined by a preset value of a channel current and a threshold voltage of the select transistor having the control gate electrode. It is, for example, approximately 1V. A voltage Vb to be applied to the p well (semiconductor substrate) is 0V.

Movement of charges when the writing operation is performed by applying such voltages will next be described. As described above, by providing a potential difference between the voltage Vs to be applied to the source region and the voltage Vd to be applied to the drain region, electrons flow in a channel region formed between the source and drain regions. At this time, a voltage Vmg of 6V has been applied to the memory gate electrode on the right side which is not operated so that a channel region is formed below the memory transistor on the right side irrespective of the charge accumulation state of the memory transistor on the right side. Electrons can therefore flow between the source and drain regions.

Electrons flowing in the channel region are accelerated in the channel region below the vicinity of the boundary between the control gate electrode and memory gate electrode on the left side and become hot electrons. In a perpendicular-oriented electric field due to positive voltage (Vmg1=12V) applied to the memory gate electrode on the left side, hot electrons are injected into the silicon nitride film (charge storage film) below the memory gate electrode on the left side. The hot electrons thus injected are captured by trap levels in the silicon nitride film. As a result, electrons are accumulated in the silicon nitride film and a threshold voltage of the memory transistor on the left side increases. The write operation to the memory transistor on the left side is performed in such a manner.

Next, an erase operation will be described. The erase operation is performed, for example, as BTBT (Band to Band Tunneling) erase using, for example, a band-to-band tunneling phenomenon. In BTBT erase, a voltage Vmg1 to be applied to the memory gate electrode on the left side is set at −6V, a voltage Vs to be applied to the source region is set at 6V, a voltage Vmg2 to be applied to the memory gate electrode on the right side is set at 0V; a voltage Vcg to be applied to the control gate electrode is set at 0V and a voltage to be applied to the drain region is set at 0V. Due to the voltage applied between the source region and memory gate electrode on the left side, holes generated by the band-to-band tunneling phenomenon at the end portion of the source region are accelerated by a high voltage applied to the source region and become hot holes. Some of the hot holes are attracted by the negative voltage applied to the memory gate electrode on the left side and injected into the silicon nitride film. The hot holes thus injected are captured by trap levels in the silicon nitride film, resulting in a decrease in a threshold voltage of the memory transistor on the left side. The erase operation is performed in such a manner.

Next, a read operation will be described. In the read operation, a voltage Vd to be applied to the drain region is set at Vdd (1.5V), a voltage Vs to be applied to the source region is set at 0V, a voltage Vcg to be applied to the control gate electrode is set at Vdd (1.5V), a voltage Vmg1 to be applied to the memory gate electrode on the left side is set at Vdd (1.5V) and a voltage Vmg2 to be applied to the memory gate electrode on the right side is set at 6V. Since a voltage of 6V is applied to the memory gate electrode on the right side, the memory transistor on the right side is turned ON, irrespective of the charge accumulation state of the memory transistor on the right side. In the memory transistor on the left side which is to be read, since the voltage Vmg1 to be applied to the memory gate electrode on the left side is Vdd (1.5V), the memory transistor on the left side is turned ON or turned OFF, depending on the charge accumulation state of the memory transistor on the left side.

For reading, a complementary reading method is employed, but it is impossible to simultaneously read two memory transistors (memory transistor on the left side and memory transistor on the right side) forming one data flash memory cell. This suggests that as two memory transistors used in the complementary reading method, two memory transistors (memory transistor on the left side and memory transistor on the right side) included in one data flash memory cell cannot be used. Accordingly, in the complementary reading method, memory transistors contained in two data flash memory cells which are different from each other are used. At this time, the above-described read operation is performed at two data flash memory cells which are complementary to each other and reading currents between two data flash memory cells are compared. If the reading current of the first data flash memory cell is greater than the reading current of the second data flash memory cell, the state is judged erase. On the other hand, when the reading current of the first data flash memory cell is smaller than the reading current of the second data flash memory cell, the state is judged write. Complementary reading can be performed in such a manner.

A method for driving the memory transistor formed on the right side of the select transistor will next be described. FIG. 9 is a table showing application conditions of a voltage to each site of the data flash memory cell at the time of "write", "erase" and "read" when the memory transistor on the right side is driven.

First, a write operation will be described. The write operation is performed by hot electron writing which is a so-called source-side injection method. During the write operation, a voltage Vd to be applied to the drain region is set at 6V; a voltage Vmg1 to be applied to the memory gate electrode on the left side is set at 6V; a voltage Vmg2 to be applied to the memory gate electrode on the right side is set at 12V; and a voltage Vcg to be applied to the control gate electrode is set at Vdd (1.5V). And, a voltage Vs to be applied to the source region is controlled so that a channel current during the write operation becomes a preset value. The voltage Vs at this time is determined by the preset value of a channel current and a threshold voltage of the select transistor having the control gate electrode. It is, for example, approximately 1V. A voltage Vb to be applied to the p well (semiconductor substrate) is 0V.

Movement of charges when a writing operation is performed by applying such voltages will next be described. As described above, by providing a potential difference between the voltage Vs to be applied to the source region and the voltage Vd to be applied to the drain region, electrons flow in a channel region formed between the source and drain regions. At this time, a voltage Vmg1 6V has been applied to the memory gate electrode on the left side which is not operated so that a channel region is formed below the memory transistor on the left side irrespective of the charge accumulation state of the memory transistor on the left side. Electrons can therefore flow between the source and drain regions.

Electrons flowing through the channel region are accelerated in the channel region below the vicinity of the boundary between the control gate electrode and memory gate electrode on the right side and become hot electrons. In a perpendicular-oriented electric field due to positive voltage (Vmg2=12V) applied to the memory gate electrode on the right side, hot electrons are injected into the silicon nitride film (charge storage film) below the memory gate electrode on the right side. The hot electrons thus injected are captured by trap levels in the silicon nitride film. As a result, electrons are accumulated in the silicon nitride film and a threshold voltage of the memory transistor on the right side increases. The write operation to the memory transistor on the right side is performed in such a manner.

Next, an erase operation will be described. The erase operation is performed, for example, as BTBT (Band to Band Tunneling) erase using, for example, a band-to-band tunneling phenomenon. In BTBT erase, for example, a voltage Vmg1 to be applied to the memory gate electrode on the left side is set at 0V, a voltage Vs to be applied to the source region is set at 0V, a voltage Vmg2 to be applied to the memory gate electrode on the right side is set at −6V; a voltage Vmg to be applied to the memory gate electrode on the right side is set at −6V; a voltage Vcg to be applied to the control gate electrode is set at 0V; and a voltage to be applied to the drain region is set at 6V. Due to the voltage applied between the drain region and memory gate electrode on the right side, holes generated by the band-to-band tunneling phenomenon at the end portion of the drain region are accelerated by a high voltage applied to the drain region and become hot holes. Some of the hot holes are attracted by the negative voltage applied to the memory gate electrode on the right side and injected into the silicon nitride film. The hot holes thus injected are captured by trap levels in the silicon nitride film, resulting in a decrease in a threshold voltage of the memory transistor on the right side. The erase operation is performed in such a manner.

Next, a read operation will be described. In the read operation, a voltage Vd to be applied to the drain region is set at 0V, a voltage Vs to be applied to the source region is set at Vdd (1.5V), a voltage Vcg to be applied to the control gate electrode is set at Vdd (1.5V), a voltage Vmg1 to be applied to the memory gate electrode on the left side is set at 6V, and a voltage Vmg2 to be applied to the memory gate electrode on the right side is set at Vdd (1.5V). Since a voltage of 6V is applied to the memory gate electrode on the left side, the memory transistor on the left side is turned ON irrespective of the charge accumulation state of the memory transistor on the left side. In the memory transistor on the right side which is to be read, since the voltage Vmg2 to be applied to the memory gate electrode on the right side is Vdd (1.5V), the memory transistor on the right side is turned ON or turned OFF, depending on the charge accumulation state of the memory transistor on the right side.

For reading, a complementary reading method is employed, but it is impossible to simultaneously read two memory transistors (memory transistor on the left side and memory transistor on the right side) forming one data flash memory cell. This suggests that as two memory transistors used in the complementary reading method, two memory transistors (memory transistor on the left side and memory transistor on the right side) included in one data flash memory cell cannot be used. Accordingly, in the complementary reading method, memory transistors included in two data flash memory cells different from each other are used. At this time, the above-described read operation is performed at two data flash memory cells which are complementary to each other and reading currents between these two data flash memory cells are compared. If the reading current of the first data flash memory cell is greater than the reading current of the second data flash memory cell, the state is judged erase. On the other hand, when the reading current of the first data flash memory cell is smaller than the reading current of the second data flash memory cell, the state is judged write. Complementary reading can be performed in such a manner.

As described above, in this Embodiment 1, the structure of the code flash memory cell is differentiated from the structure of the data flash memory cell. Described specifically, the code flash memory cell stores a program which needs high speed reading so that the code flash memory cell is a memory cell which gives preference to a reading speed of data over prevention of deterioration of retention properties caused by repetition of rewriting. In the code flash memory cell, therefore, the memory transistor (memory portion) is formed only on one side of the select transistor (select portion) to raise the reading speed.

The data flash memory cell, on the other hand, stores data which are to be rewritten frequently. The data flash memory cell is therefore a memory cell which gives preference to prevention of deterioration of retention properties caused by repetition of rewriting over the reading speed of data. In the data flash memory cell, the memory transistor (memory portion) is formed on both sides of the select transistor (select portion). According to this Embodiment 1, by differentiating the structure of the code flash memory cell from the structure of the data flash memory cell, it is possible to employ memory cell structures suited for their properties required of them respectively and reduce an area to be occupied by the memory.

In the code flash memory cell, it seems to be possible to reduce an area occupied by the whole flash memory also by forming a memory transistor over the side surfaces on both sides of the select transistor. If a memory transistor is formed over the side surfaces on both sides of the select transistor, however, high speed reading of one memory transistor is hindered by the presence of the other memory transistor. This means that in reading one memory transistor, accumulation of electrons in the other memory transistor disturbs smooth flow of a reading current. In the code flash memory cell required to have a high reading speed, a memory transistor is formed only on one side of the select transistor.

A manufacturing method of the semiconductor device according to this Embodiment 1 will next be described referring to some drawings.

Figure 10:
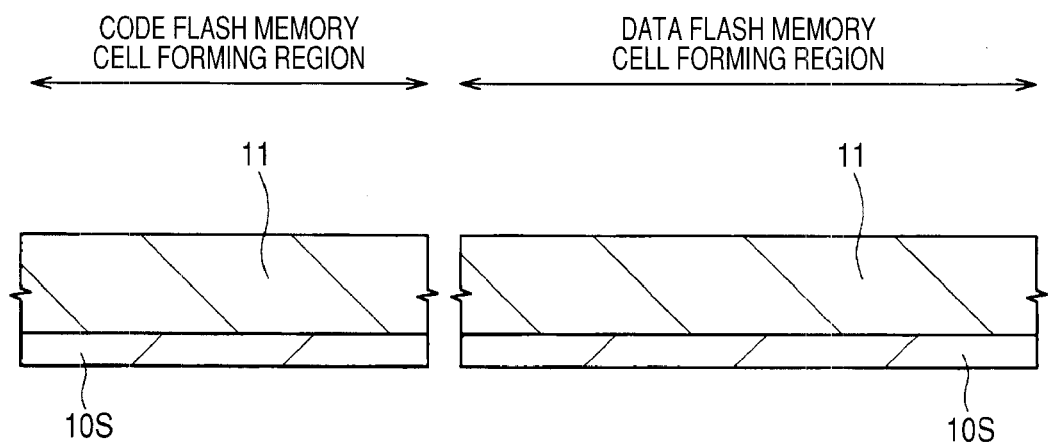
FIG. 10 is a cross-sectional view illustrating a manufacturing step of the semiconductor device according to Embodiment 1.

As illustrated in FIG. 10, a semiconductor substrate 10S made of a silicon single crystal having a p type impurity such as boron (B) introduced therein is prepared. The semiconductor substrate 10S thus prepared is in the form of a silicon wafer having a substantially disc shape. An element isolation region for isolating a low-breakdown-voltage MISFET forming region from a high-breakdown-voltage MISFET forming region is formed in the semiconductor substrate 10S. This element isolation region is placed in order to avoid mutual interference of elements. This element isolation region can be formed using, for example, LOCOS (local oxidation of silicon) method or STI (shallow trench isolation) method. For example, in the STI method, the element isolation region is formed in the following manner. First, an element isolation trench is formed in the semiconductor substrate 10S by using photolithography and etching. A silicon oxide film is deposited over the semiconductor substrate 10S to fill it the element isolation trench. By chemical mechanical polishing (CMP), an unnecessary portion of the silicon oxide film formed over the semiconductor substrate 10S is removed. By this, the silicon oxide film is filled only in the element isolation trench. The element isolation region can thus be formed. FIG. 10 illustrates a memory cell forming region but does not include the element isolation region.

An impurity is then introduced into an active region isolated by the element isolation regions to form a p well 11. The p well 11 is formed by introducing a p type impurity such as boron into the semiconductor substrate 10S by ion implantation. Semiconductor regions (not illustrated) for forming a channel of a select transistor are formed in the surface region of the p well 11. The semiconductor regions for forming a channel are formed in order to control a threshold voltage forming the channel.

Figure 11:
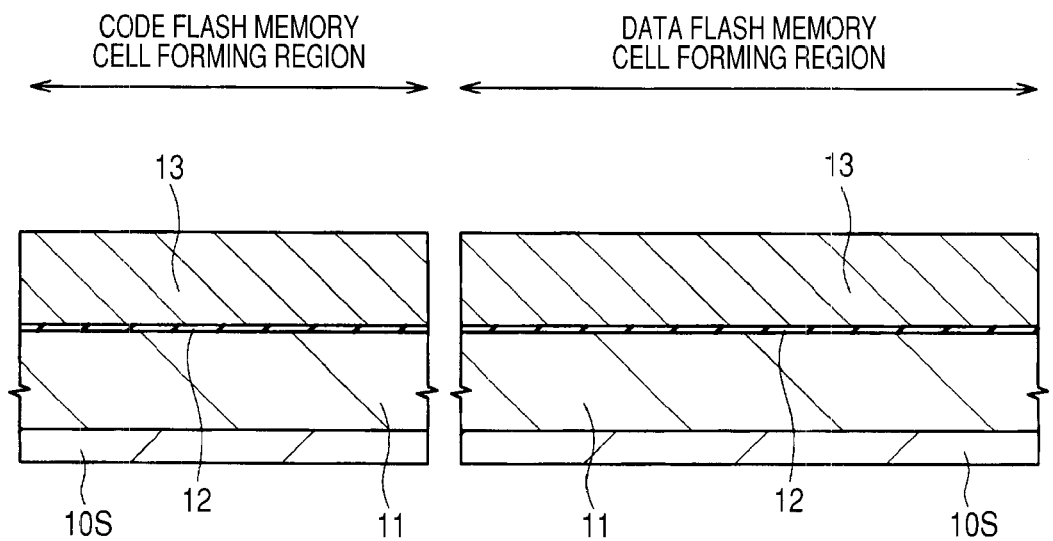
FIG. 11 is a cross-sectional view illustrating a manufacturing step following that of FIG. 10.

As illustrated in FIG. 11, a gate insulating film 12 is deposited over the semiconductor substrate 10S. The gate insulating film 12 is made of, for example, a silicon oxide film and can be formed using, for example, thermal oxidation. The gate insulating film 12 is however not limited to a silicon oxide film, but various films can be employed instead. For example, the gate insulating film 12 may be made of a silicon oxynitride (SiON) film. This means that nitrogen may be segregated to the interface between the gate insulating film 12 and the semiconductor substrate 10S. The silicon oxynitride film is highly effective for preventing generation of an interface level in the film or reducing an electron trap compared with the silicon oxide film. The gate insulating film 12 made of the silicon oxynitride film can therefore have improved hot carrier resistance and improved insulation resistance. In addition, the silicon oxynitride film does not permit easy penetration of an impurity therethrough compared with the silicon oxide film so that use of the silicon oxynitride film as the gate insulating film 12 enables prevention of variations in a threshold voltage due to diffusion of the impurity in a gate electrode to the side of the semiconductor substrate 10S. The silicon oxynitride film may be deposited over the semiconductor substrate 10S by heat treating it in a nitrogen-containing atmosphere such as NO, $NO_2$ or $NH_3$ atmosphere. A similar effect is available by, after formation of the gate insulating film 12 made of a silicon oxide film over the surface of the semiconductor substrate 10S, heat treating the semiconductor substrate 10S in a nitrogen-containing atmosphere to segregate nitrogen to the interface between the gate insulating film 12 and the semiconductor substrate 10S.

The gate insulating film 12 may be formed, for example, from a high dielectric constant film having a higher dielectric constant than that of a silicon oxide film. A silicon oxide film has conventionally been employed as the gate insulating film 12 from the viewpoint that it has high insulation resistance and is excellent in electrical/physical stability on a silicon/silicon oxide interface. With elements becoming finer, the gate insulating film 12 has been required to be ultrathin. Use of such a thin silicon oxide film as the gate insulating film 12 undesirably generates a so-called tunneling current, that is, flow of electrons running through the channel of MISFET to a gate electrode while tunneling a barrier formed by the silicon oxide film.

A high dielectric constant film using a material having a higher dielectric constant than that of a silicon oxide film, thereby increasing its physical thickness even their capacity is equal has come to be used. By the use of such a high dielectric constant film, the physical thickness can be raised even if the capacity is equal. As a result, a leakage current can be reduced.

As the high dielectric constant film, a film of hafnium oxide ($HfO_2$) which is one of hafnium oxides is, for example, used. Instead of the hafnium oxide film, another hafnium insulating film such as hafnium aluminate film HfON film (hafnium oxynitride film), HfSiO film (hafnium silicate film), HfSiON film (hafnium silicon oxynitride film) or HfAlO film is also usable. A hafnium insulating film obtained by introducing therein an oxide such as tantalum oxide, niobium oxide, titanium oxide, zirconium oxide, lanthanum oxide or yttrium oxide is also usable. Since the hafnium insulating film has, as well as a hafnium oxide film, a higher dielectric constant than a silicon oxide film or a silicon oxynitride film so that it can produce a similar effect to that available by a hafnium oxide film.

A polysilicon film 13 is then deposited over the gate insulating film 12. The polysilicon film 13 can be formed using, for example, by CVD. An n type impurity such as phosphorus or arsenic is then introduced into the polysilicon film 13 by photolithography and ion implantation.

Figure 12:
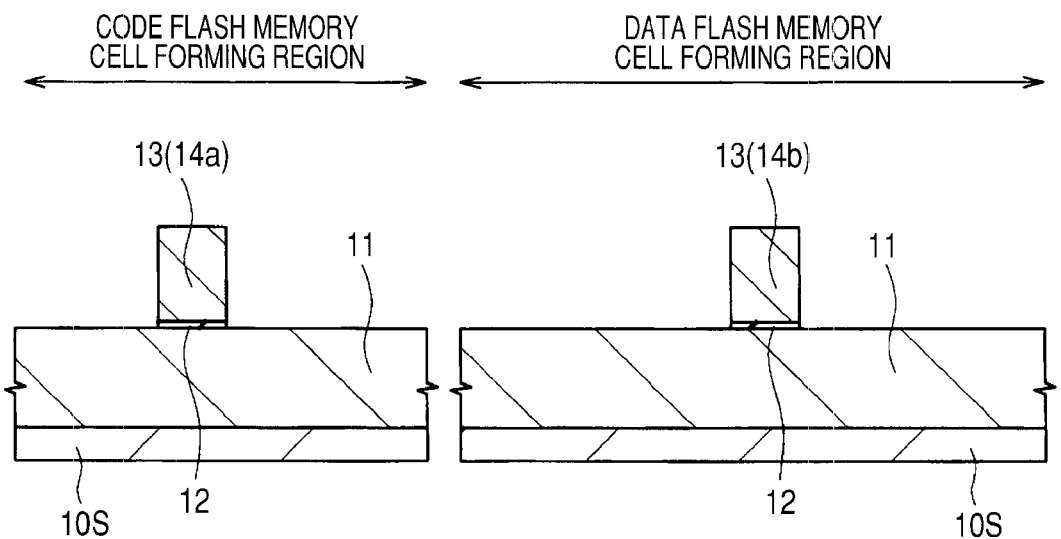
FIG. 12 is a cross-sectional view illustrating a manufacturing step following that of FIG. 11.

As illustrated in FIG. 12, the polysilicon film 13 is etched with a patterned resist film as a mask to form a control gate electrode 14a in a code flash memory cell forming region and a control gate electrode 14b in a data flash memory cell forming region. The control gate electrode 14a is a gate electrode of a select transistor of the code flash memory cell, while the control gate electrode 14b is a gate electrode of a select transistor of the data flash memory cell.

Into the polysilicon film 13 of the control gate electrodes 14a and 14b, an n type impurity has been introduced. A work function of the control gate electrode 14a or 14b can therefore be approximated to that (4.15 eV) of the conduction band of silicon, making it possible to reduce the threshold voltage of the select transistor which is an n channel MISFET.

Figure 13:
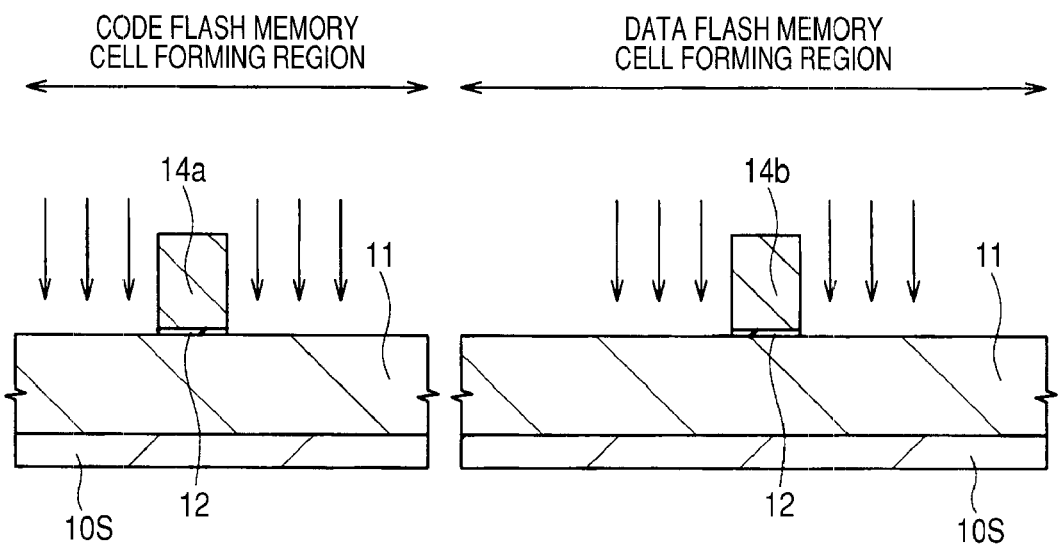
FIG. 13 is a cross-sectional view illustrating a manufacturing step following that of FIG. 12.

As illustrated in FIG. 13, an n type impurity such as phosphorus or arsenic is introduced in alignment with the control gate electrode 14a and control gate electrode 14b by using photolithography and ion implantation. This step is performed to control the threshold value of a memory transistor to be formed over the side surface of the control gate electrode 14a and 14b as will be described later.

A film stack is then formed over the semiconductor substrate 10S while covering the control gate electrode 14a and 14b therewith. The film stack is made of, for example, a silicon oxide film 15, a silicon nitride film 16 deposited on the silicon oxide film 15, and a silicon oxide film 17 deposited on the silicon nitride film 16 (ONO film). Of these films forming the film stack, the silicon nitride film 16 will be a charge storage film of a memory transistor. In this Embodiment 1, the silicon nitride film 16 is used as the charge storage film, but another insulating film having trap levels may be used as the charge storage film. For example, an aluminum oxide film (alumina film) may be used as the charge storage film. A polysilicon film 18 is then deposited over the film stack.

Figure 16:
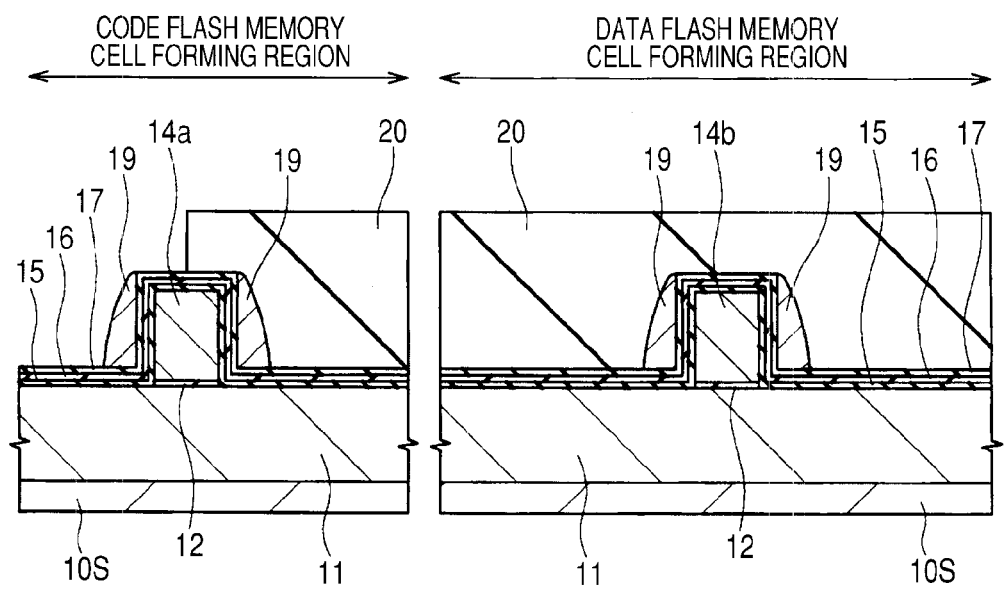
FIG. 16 is a cross-sectional view illustrating a manufacturing step following that of FIG. 15.

As illustrated in FIG. 16, the polysilicon film 18 is then anisotropically etched to leave the polysilicon film 19 over the side surfaces on both sides of each of the control gate electrodes 14a and 14b. The polysilicon film 19 remains over the side surfaces on both sides of the control gate electrode 14a in the code flash memory cell forming region, while the polysilicon film 19 remains over the side surfaces on both sides of the control gate electrode 14b in the data flash memory cell forming region.

As illustrated in FIG. 16, after a resist film 20 is formed over the semiconductor substrate 10S by application, the resist film 20 is patterned by exposure/development. This patterning is performed so as to completely cover the data flash memory cell forming region while opening a portion of the code flash memory cell forming region. Described specifically, this patterning is performed to expose the polysilicon film 19 formed over the side surface on one side of the control gate electrode 14a in the code flash memory cell forming region. For example, in FIG. 16, the polysilicon film 19 formed over the side surface on the left side of the control gate electrode 14a formed in the code flash memory cell forming region is exposed.

Figure 17:
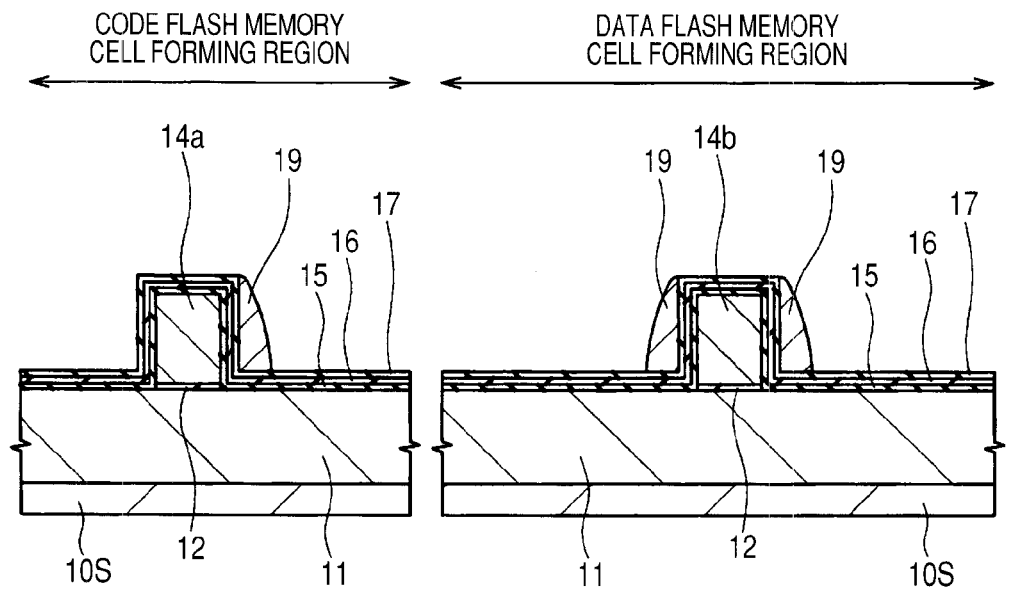
FIG. 17 is a cross-sectional view illustrating a manufacturing step following that of FIG. 16.

As illustrated in FIG. 17, the polysilicon film 19 exposed over the side surface on the left side of the control gate electrode 14a is then removed by etching with the patterned resist film 20 as a mask. The polysilicon film 19 formed over the side surface on the right side of the control gate electrode 14a and the polysilicon film 19 formed over the side surfaces on both sides of the control gate electrode 14b are not removed because they are covered with the resist film 20. The patterned resist film 20 is then removed.

Figure 18:
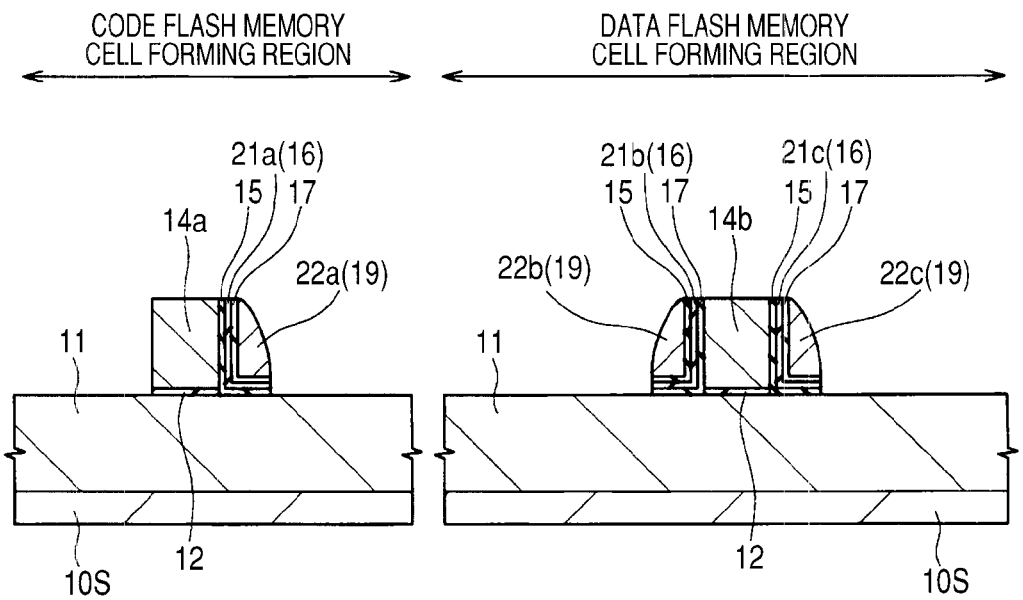
FIG. 18 is a cross-sectional view illustrating a manufacturing step following that of FIG. 17.

As illustrated in FIG. 18, the exposed ONO film is removed by etching. In such a manner, in the code flash memory cell forming region, a memory gate electrode 22a having a sidewall shape is formed only over the side surface on the right side of the control gate electrode 14a via the film stack (ONO film). The silicon nitride film 16 forming the film stack (ONO film) becomes a charge storage film 21a. In the data flash memory cell forming region, on the other hand, memory gate electrodes 22b and 22c are formed over the side surfaces on both sides of the control gate electrode 14b via the film stack. For example, in FIG. 18, the memory gate electrode 22b having a sidewall shape is formed over the side surface on the left side of the control gate electrode 14b and the silicon nitride film 16 sandwiched between the memory gate electrode 22b and control gate electrode 14b becomes a charge storage film 21b. Similarly, the memory gate electrode 22c having a sidewall shape is formed over the side surface on the right side of the control gate electrode 14b and the silicon nitride film 16 sandwiched between the memory gate electrode 22c and the control gate electrode 14b becomes a charge storage film 21c.

Figure 19:
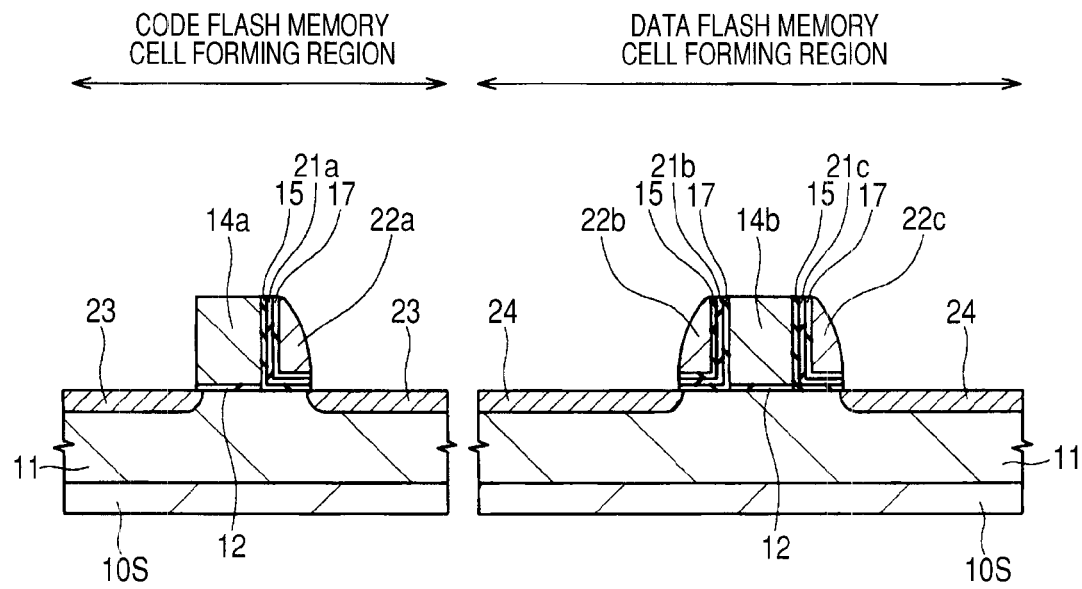
FIG. 19 is a cross-sectional view illustrating a manufacturing step following that of FIG. 18.

As illustrated in FIG. 19, shallow lightly-doped impurity diffusion regions 23 are then formed in alignment with the control gate electrode 14a and memory gate electrode 22a in the code flash memory cell forming region by using photolithography and ion implantation. The shallow lightly-doped impurity diffusion regions 23 are n type semiconductor regions into which an n type impurity such as phosphorus or arsenic has been introduced. In a similar step, shallow lightly-doped impurity diffusion regions 24 are formed in alignment with the control gate electrode 14b and the memory gate electrodes 22b and 22c formed over the side surfaces on both sides of the control gate electrode 14b in the data flash memory cell forming region. These shallow lightly-doped impurity diffusion regions 24 are also n type semiconductor regions into which an n type impurity such as phosphorus or arsenic has been introduced.

Figure 20:
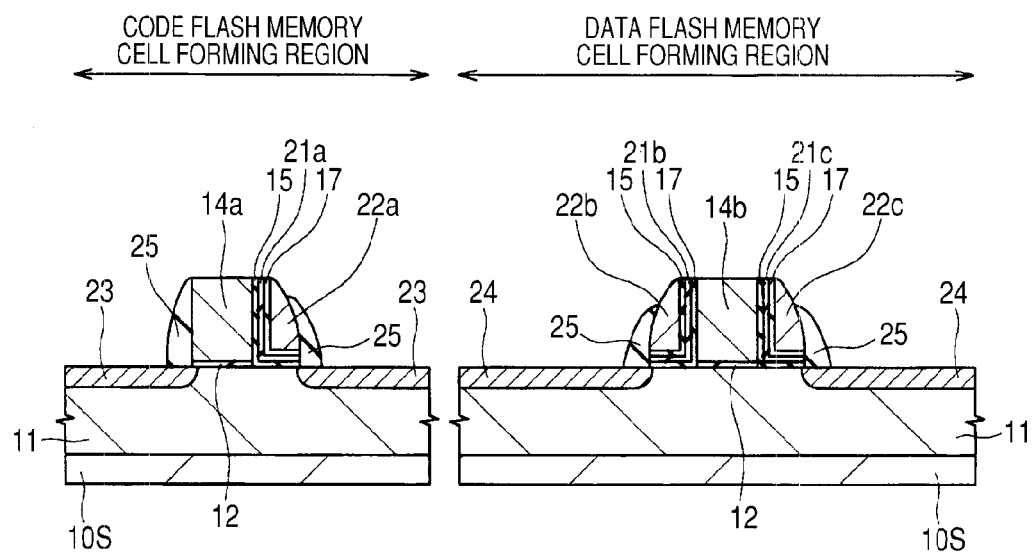
FIG. 20 is a cross-sectional view illustrating a manufacturing step following that of FIG. 19.

As illustrated in FIG. 20, a silicon oxide film is then deposited over the semiconductor substrate 10S. This silicon oxide film can be formed using, for example, CVD. The silicon oxide film is then anisotropically etched to form a sidewall 25. In the code flash memory cell forming region, the sidewall 25 is formed over the side surface on the left side of the control gate electrode 14a and over the side surface on the right side of the memory gate electrode 22a. In the data flash memory cell forming region, on the other hand, the sidewall 25 is formed over the side surface on the left side of the memory gate electrode 22b and over the side surface on the right side of the memory gate electrode 22c. These sidewalls 25 are each made of a single-layer silicon oxide film. The sidewalls 25 are not limited to it but may be made of a film stack of, for example, a silicon nitride film and a silicon oxide film.

Figure 21:
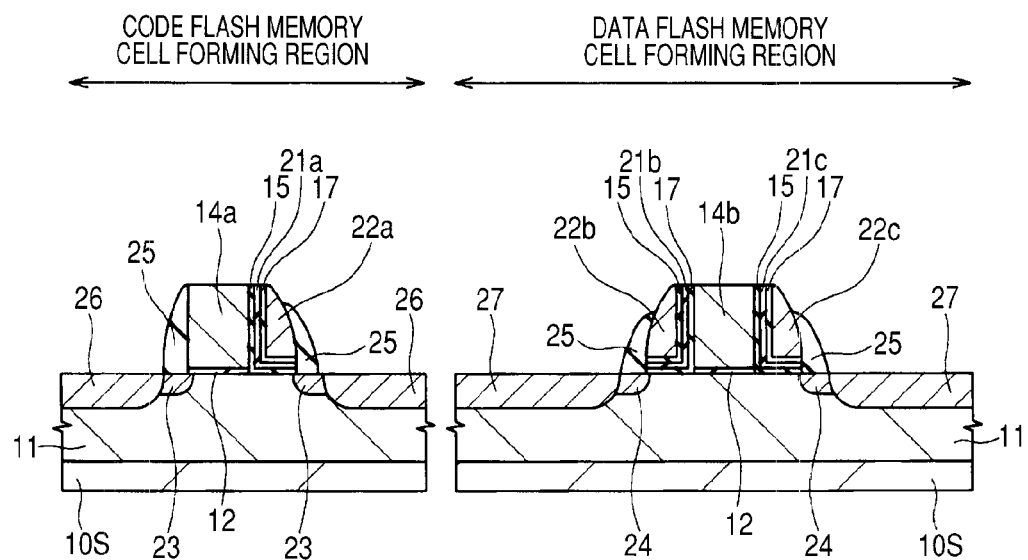
FIG. 21 is a cross-sectional view illustrating a manufacturing step following that of FIG. 20.

As illustrated in FIG. 21, deep heavily-doped impurity diffusion regions 26 are then formed in alignment with the sidewalls 25 in the code flash memory cell forming region by using photolithography and ion implantation. These deep heavily-doped impurity diffusion regions 26 are n type semiconductor regions into which an n type impurity such as phosphorus or arsenic has been introduced. From these deep heavily-doped impurity diffusion regions 26 and shallow lightly-doped impurity diffusion regions 23, the source region and drain region of the code flash memory cell are formed. The source and drain regions made of shallow lightly-doped impurity diffusion regions 23 and deep heavily-doped impurity diffusion regions 26 can have an LDD (Lightly Doped Drain) structure.

Similarly, deep heavily-doped impurity diffusion regions 27 are then formed in alignment with the sidewalls 25 in the data flash memory cell forming region by using photolithography and ion implantation. These deep heavily-doped impurity diffusion regions 27 are also n type semiconductor regions into which an n type impurity such as phosphorus or arsenic has been introduced. From these deep heavily-doped impurity diffusion regions 27 and shallow lightly-doped impurity diffusion regions 24, the source region and drain region of the data flash memory cell are formed. The source and drain regions made of shallow lightly-doped impurity diffusion regions 24 and deep heavily-doped impurity diffusion regions 27 can have an LDD (Lightly Doped Drain) structure.

After formation of the heavily-doped impurity diffusion regions 26 and heavily-doped impurity diffusion regions 27 in such a manner, heat treatment is performed at approximately 1000° C. to activate the impurities introduced into these regions.

Figure 22:
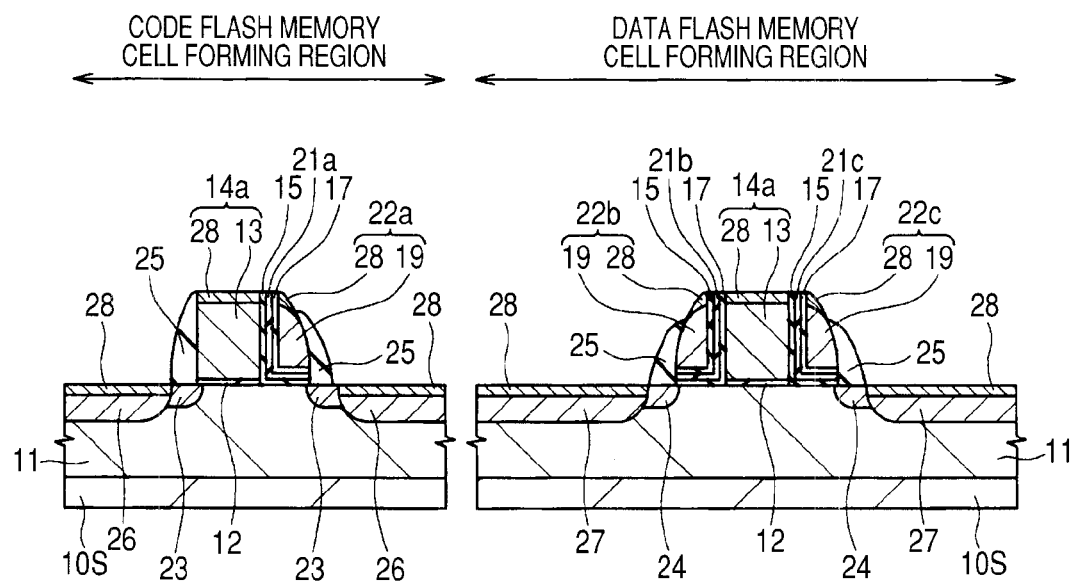
FIG. 22 is a cross-sectional view illustrating a manufacturing step following that of FIG. 21.

As illustrated in FIG. 22, a cobalt film is deposited over the semiconductor substrate 10S. At this time, the cobalt film is deposited so as to be brought into direct contact with the exposed portions of the control gate electrodes 14a and 14b, and the memory gate electrodes 22a, 22b and 22c. Simultaneously, the cobalt film is brought into direct contact with the deep heavily-doped impurity diffusion regions 26 and heavily-doped impurity diffusion regions 27.

The cobalt film can be formed example by sputtering. After formation of the cobalt film, heat treatment is performed to cause reaction between the cobalt film and the polysilicon films 13 and 19 forming the control gate electrodes 14a and 14b and the memory gate electrodes 22a to 22c to form a cobalt silicide film 28. By this treatment, the control gate electrodes 14a and 14b, and the memory gate electrodes 22a to 22c have a stack structure of the polysilicon film 13 or 19 and the cobalt silicide film 28. This cobalt silicide film 28 is formed in order to reduce the resistance of the control gate electrodes 14a and 14b, and the memory gate electrodes 22a to 22c. Similarly, by the above-described heat treatment, the cobalt silicide film 28 is formed on the surface of the heavily-doped impurity diffusion regions 26 and heavily-doped impurity diffusion regions 27 as a result of reaction between silicon and the cobalt film. This makes it possible to reduce the resistance also in these heavily-doped impurity diffusion regions 26 and heavily-doped impurity diffusion regions 27.

An unreacted cobalt film over the semiconductor substrate 10S is then removed. The cobalt silicide film 28 formed in this Embodiment may be replaced, for example, by a nickel silicide film or a titanium silicide film.

In the above-described manner, the code flash memory cell is formed in the code flash memory cell forming region, while the data flash memory cell is formed in the data flash memory cell forming region. Described specifically, in this Embodiment 1, the memory gate electrode 22a is formed only over the side surface on one side of the control gate electrode 14a in the code flash memory cell. This structure makes it possible to improve a reading speed compared with that of a structure in which a memory gate electrode is formed over the side surfaces on both sides of a control gate electrode.

In the data flash memory cell in this Embodiment 1, on the other hand, an area occupied by the data flash memory cell is reduced by forming the memory gate electrodes 22a and 22b over the side surfaces on both sides of the control gate electrode 14b. By changing the data flash memory cell from a binary memory cell to a multivalued memory cell, it has high reliability while preventing deterioration of retention properties. At the same time, an area occupied by the data flash memory cell can be reduced. In this Embodiment 1, the structure of the code flash memory cell is differentiated from the structure of the data flash memory cell so that it is possible to employ memory cell structures suited for their properties required of them, while reducing an area occupied by them.

A metallization step will next be described referring to FIG. 3. As illustrated in FIG. 3, a silicon oxide film 29 which will be an interlayer insulating film is formed over the main surface of the semiconductor substrate 10S. This silicon oxide film 29 can be formed by CVD while using, for example, TEOS (tetraethyl orthosilicate) as a raw material. The surface of the silicon oxide film 29 is then planarized, for example, by CMP (chemical mechanical polishing).

A contact hole 30 is then formed in the silicon oxide film 29 by photolithography and etching. A titanium/titanium nitride film 31a is then deposited over the silicon oxide film 29 including the bottom surface and inner wall of the contact hole 30. The titanium/titanium nitride film 31a is a film stack of a titanium film and a titanium nitride film and can be formed, for example, using sputtering. This titanium/titanium nitride film 31a can prevent diffusion of tungsten, which is a material to be filled in the later step, into silicon. In short, it has a so-called barrier property.

A tungsten film 31*b* is then deposited all over the main surface of the semiconductor substrate 10S so as to fill it in the contact hole 30. This tungsten film 31*b* can be deposited, for example, by CVD. An unnecessary portion of the titanium/titanium nitride film 31*a* and tungsten film 31*b* deposited over the silicon oxide film 29 are then removed, for example, by CMP to form a plug 32.

A titanium/titanium nitride film 33*a*, a copper-containing aluminum film 33*b*, and titanium/titanium nitride film 33*c* are deposited successively over the silicon oxide film 29 and plug 32. These films can be formed using, for example, sputtering. These films are then patterned using photolithography and etching to form an interconnect 34. Upper-level interconnects are also formed over the interconnect 34, but description on it is omitted. The manufacture of the semiconductor device of this Embodiment 1 can be completed in such a manner.

Embodiment 2

In this Embodiment 2, an example of differentiating the structure of a code flash memory cell from that of a data flash memory cell as in Embodiment 1 and at the same time, differentiating a threshold voltage of a memory transistor of the code flash memory cell from that of a memory transistor of the data flash memory cell will be described.

The structure of the semiconductor device according to Embodiment 2 is similar to that of Embodiment 1 shown in FIG. 3. This means that the structure of the code flash memory cell is different from that of the data flash memory cell. The code flash memory cell is a memory cell which gives preference to a high reading speed of data over prevention of deterioration of retention properties which occur by the repetition of rewriting. The reading speed is raised by forming a memory transistor (memory portion) only on one side of a select transistor (select portion). The data flash memory cell is on the other hand a memory cell which gives preference to prevention of deterioration of retention properties which occurs by repetition of rewriting over a high reading speed of data. A memory transistor (memory portion) is formed on both sides of a select transistor (select portion). Such a structure enables to produce effects for reducing an area occupied by the code flash memory cell and data flash memory cell while employing memory cell structures suited for their properties required thereof.

A difference in the structure between Embodiment 2 and Embodiment 1 resides in that the threshold voltage of the memory transistor (memory portion) forming the code flash memory cell is different from the threshold voltage of the memory transistor (memory portion) forming the data flash memory cell. Described specifically, Embodiment 2 is characterized by that the threshold voltage of the memory transistor forming the data flash memory cell is lower than the threshold voltage of the memory transistor forming the code flash memory cell.

The following is a reason why the threshold voltage of the memory transistor forming the data flash memory cell is set lower. The data flash memory cell is a memory for storing data to be rewritten frequently and it gives preference to prevention of deterioration of retention properties over improvement of a reading speed. From the viewpoint of preventing deterioration of retention properties, it is desired to reduce the threshold voltage of the memory transistor. A reduction in the threshold voltage of the memory transistor leads to prevention of deterioration of retention properties of the data flash memory cell. The memory transistor forming the data flash memory cell therefore has a reduced threshold voltage.

The memory transistor has desirably a reduced threshold voltage in order to prevent deterioration of retention properties. A reduction in the threshold voltage of the memory transistor however has an adverse effect of reducing the reading speed. It is therefore impossible to excessively reduce the threshold voltage of the memory cell transistor in the code flash memory cell which gives preference to improvement of a reading speed. In Embodiment 2, the threshold voltage is reduced from the viewpoint of preventing further deterioration of retention properties of the data flash memory cell. In the code flash memory cell, on the other hand, the threshold voltage is made higher than that of the data flash memory cell in order to improve the reading speed. In practice, it is possible to differentiate the threshold voltage of the memory cell transistor forming the code flash memory cell from the threshold voltage of the memory transistor forming the data flash memory cell by changing the impurity concentration of a channel region just below the memory transistor (memory gate electrode). Described specifically, it is only necessary to increase the n type impurity concentration of the channel region just below the memory transistor (memory gate electrode) forming the data flash memory cell in order to make the threshold voltage of the memory transistor forming the data flash memory cell lower than the threshold voltage of the memory transistor forming the code flash memory cell.

Figure 23:
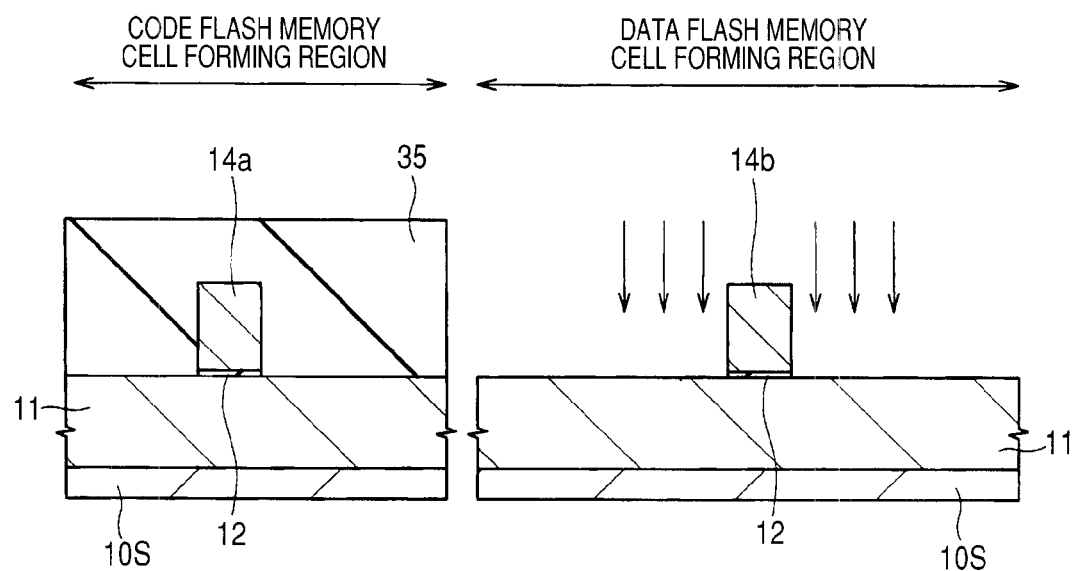
FIG. 23 is a cross-sectional view illustrating a manufacturing step of a semiconductor device according to Embodiment 2.

A manufacturing method of the semiconductor device of Embodiment 2 will next be described. Principally, the manufacturing steps of the semiconductor device of Embodiment 2 are similar to the manufacturing steps of the semiconductor device of Embodiment 1 shown in FIGS. 10 to 22. A difference resides in that a step illustrated in FIG. 23 is added after the step of FIG. 13 but before the step of FIG. 14.

Figure 14:
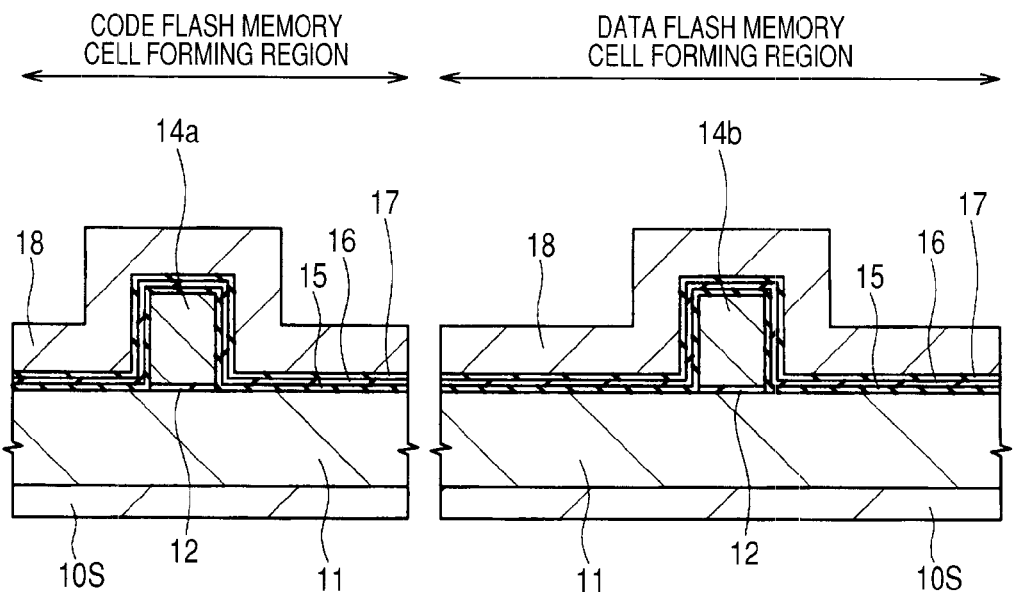
FIG. 14 is a cross-sectional view illustrating a manufacturing step following that of FIG. 13.
Figure 15:
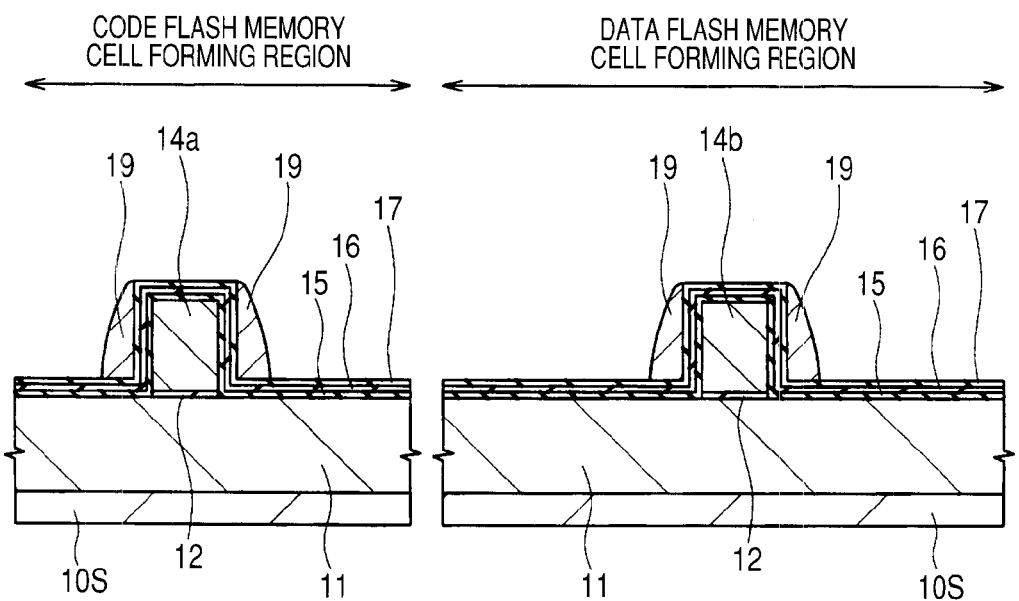
FIG. 15 is a cross-sectional view illustrating a manufacturing step following that of FIG. 14.

As illustrated in FIG. 13, an n type impurity such as phosphorus or arsenic is introduced in alignment with the control gate electrodes 14*a* and 14*b* in the code flash memory cell forming region and the data flash memory cell forming region. As illustrated in FIG. 14, a patterned resist film 35 is then deposited over the semiconductor substrate 10S. The resist film 35 is patterned by opening the data flash memory cell forming region while completely covering the code flash memory cell forming region. By ion implantation with the patterned resist film 35 as a mask, an n type impurity such as phosphorus or arsenic is introduced into the data flash memory cell forming region. An impurity having the same conductivity type as that used in the step shown in FIG. 13 is introduced into the data flash memory cell forming region. More specifically, an n type impurity is introduced into both sides of the control gate electrode 14*b*. This makes it possible to increase the n type impurity concentration of a channel region just below the memory gate electrode which will be formed by a later step.

Steps after that are similar to those of Embodiment 1. In such a manner, the threshold voltage of the memory transistor forming the data flash memory cell can be made lower than the threshold voltage of the memory transistor forming the code flash memory cell. In Embodiment 2, the structure is similar to that of Embodiment 1 except that the threshold voltage of the memory transistor forming the data flash memory cell is made lower than the threshold voltage of the memory transistor forming the code flash memory cell. Accordingly, the semiconductor device of Embodiment 2 can produce a similar advantage to that of Embodiment 1.

The present invention made by the present inventors has so far been described specifically based on its embodiments. It should however be borne in mind that the invention is not limited to or by these embodiments but can be changed without departing from the scope of the invention.

The present invention can be used widely in the manufacture industry of semiconductor devices.

The invention claimed is:

1. A manufacturing method of a semiconductor device by forming a first nonvolatile memory cell in a first region of a semiconductor substrate and a second nonvolatile memory cell in a second region of the semiconductor substrate, comprising the steps of:
   (a) depositing an insulating film over the whole surface of the semiconductor substrate including the first region and the second region to form a first gate insulating film in the first region and a third gate insulating film in the second region;
   (b) depositing a first conductor film over the first gate insulating film and the third gate insulating film;
   (c) patterning the first conductor film to form a first control gate electrode of the first nonvolatile memory cell in the first region and a second control gate electrode of the second nonvolatile memory cell in the second region;
   (d) introducing an impurity into the semiconductor substrate in alignment with the first control electrode and into the semiconductor substrate in alignment with the second control electrode;
   (e) forming a film stack of insulating films over the whole surface of the semiconductor substrate covering the first control gate electrode formed in the first region and the second control gate electrode formed in the second region;
   (f) depositing a second conductor film over the film stack;
   (g) anisotropically etching the second conductor film to form a sidewall comprised of the second conductor film over the side surfaces on both sides of the first control gate electrode in the first region and over the side surfaces on both sides of the second control gate electrode in the second region;
   (h) removing the sidewall formed over the side surface on one side of the first control gate electrode in the first region; and
   (i) removing the film stack exposed from the semiconductor substrate,
   wherein a first memory gate electrode is formed by the sidewall remaining over the side surface on one side of the first control gate electrode, thereby forming the first nonvolatile memory cell which is a binary memory cell in the first region, and
   wherein a second memory gate electrode and a third memory gate electrode are formed by the sidewall remaining over the side surfaces on both sides of the second control gate electrode, thereby forming the second nonvolatile memory cell which is a multivalued memory cell in the second region.

2. A manufacturing method of a semiconductor device according to claim 1,
   wherein in the first region, a second gate insulating film, a first charge storage film formed over the second gate insulating film, and a first insulating film formed over the first charge storage film are each comprised of the film stack formed between the first control gate electrode and the first memory gate electrode and between the first memory gate electrode and the semiconductor substrate, and
   wherein in the second region, a third gate insulating film, a second charge storage film formed over the third gate insulating film, and a second insulating film formed over the second charge storage film are each comprised of the film stack formed between the second control gate electrode and the second memory gate electrode and between the second memory gate electrode and the semiconductor substrate, and a fourth gate insulating film, a third charge storage film formed over the fourth gate insulating film, and a third insulating film formed over the third charge storage film are each comprised of the film stack formed between the second control gate electrode and the third memory gate electrode and between the third memory gate electrode and the semiconductor substrate.

3. A manufacturing method of a semiconductor device according to claim 2,
   wherein the first charge storage film, the second charge storage film, and the third charge storage film are each made of an insulating film having trap levels for capturing charges therein.

4. A manufacturing method of a semiconductor device according to claim 3,
   wherein the first charge storage film, the second charge storage film, and the third charge storage film are each made of a silicon nitride film.

5. A manufacturing method of a semiconductor device according to claim 1, further comprising, after the step (d) before the step (e), a step of:
   (j) introducing an impurity into the semiconductor substrate in alignment with the second control gate electrode while masking the first region and opening the second region.

6. A manufacturing method of a semiconductor device according to claim 5,
   wherein the impurity introduced in the step (d) and the impurity introduced in the step (j) have the same conductivity type.

* * * * *